US 9,564,589 B2

(12) United States Patent
Awano et al.

(10) Patent No.: US 9,564,589 B2
(45) Date of Patent: Feb. 7, 2017

(54) FORMING METHOD AND FORMING APPARATUS OF CARBON NANOTUBES

(71) Applicant: FUJITSU LIMITED, Kawasaki-shi, Kanagawa (JP)

(72) Inventors: Yuji Awano, Kawasaki (JP); Noriyoshi Shimizu, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 34 days.

(21) Appl. No.: 14/671,274

(22) Filed: Mar. 27, 2015

(65) Prior Publication Data

US 2015/0207074 A1  Jul. 23, 2015

Related U.S. Application Data

(62) Division of application No. 13/705,778, filed on Dec. 5, 2012, now Pat. No. 9,017,636, which is a division of
(Continued)

(30) Foreign Application Priority Data

Jun. 30, 2003 (JP) .................................. 2003-187331
Aug. 22, 2003 (JP) .................................. 2003-298337

(51) Int. Cl.
*H01L 51/00* (2006.01)
*H01L 51/05* (2006.01)
(Continued)

(52) U.S. Cl.
CPC ........... *H01L 51/0002* (2013.01); *B82Y 10/00* (2013.01); *B82Y 30/00* (2013.01); *B82Y 40/00* (2013.01);
(Continued)

(58) Field of Classification Search
CPC .............. C01B 31/022; C01B 31/0226; C01B 31/0233; C01B 31/024; C01B 31/0246; C01B 31/0253; C01B 31/026; C01B 31/0266; C01B 31/0273; C01B 31/028; C01B 31/0286; C01B 31/0293; C01B 2202/00; C01B 2202/02; C01B 2202/04
(Continued)

(56) References Cited

U.S. PATENT DOCUMENTS 5,973,444 A   10/1999  Xu et al.
6,628,053 B1   9/2003  Den et al.
(Continued)

FOREIGN PATENT DOCUMENTS

JP       7-113169 A     5/1995
JP    2002-141633 A1    5/2002
(Continued)

OTHER PUBLICATIONS

Seto, et al., Fabrication of silicon nanostructured films by deposition of size-selected nanoparticles generated by pulsed laser ablation, Thin Solid Films 2003; 437: 230-234.*
(Continued)

*Primary Examiner* — Daniel C McCracken
(74) *Attorney, Agent, or Firm* — Westerman, Hattori, Daniels & Adrian, LLP

(57) ABSTRACT

A deposition method of fine particles, includes the steps of irradiating a fine particle beam formed by size-classified fine particles to an irradiated subject under a vacuum state, and depositing the fine particles on a bottom part of a groove structure formed at the irradiated subject.

18 Claims, 20 Drawing Sheets

Related U.S. Application Data application No. 12/732,939, filed on Mar. 26, 2010, now abandoned, which is a division of application No. 10/874,392, filed on Jun. 24, 2004, now abandoned.

(51) Int. Cl.

| | | |
|---|---|---|
| *C23C 16/46* | (2006.01) | |
| *C01B 31/02* | (2006.01) | |
| *C23C 16/48* | (2006.01) | |
| *B82Y 10/00* | (2011.01) | |
| *B82Y 30/00* | (2011.01) | |
| *B82Y 40/00* | (2011.01) | |
| *C23C 14/22* | (2006.01) | |
| *C23C 16/04* | (2006.01) | |
| *C23C 16/26* | (2006.01) | |
| *H01L 21/768* | (2006.01) | |
| *H01L 23/532* | (2006.01) | |
| *H01L 29/06* | (2006.01) | |
| *H01L 29/775* | (2006.01) | |

(52) U.S. Cl.
CPC ....... *C01B 31/0226* (2013.01); *C01B 31/0233* (2013.01); *C23C 14/221* (2013.01); *C23C 14/228* (2013.01); *C23C 16/04* (2013.01); *C23C 16/26* (2013.01); *C23C 16/463* (2013.01); *C23C 16/48* (2013.01); *H01L 21/768* (2013.01); *H01L 21/76867* (2013.01); *H01L 21/76876* (2013.01); *H01L 21/76879* (2013.01); *H01L 23/53276* (2013.01); *H01L 29/0673* (2013.01); *H01L 29/0676* (2013.01); *H01L 51/0048* (2013.01); *H01L 51/0558* (2013.01); *C01B 2202/36* (2013.01); *H01L 29/775* (2013.01); *H01L 2221/1094* (2013.01); *H01L 2924/0002* (2013.01); *Y10S 977/843* (2013.01)

(58) Field of Classification Search
USPC ........ 423/447.1–447.3, 445 B; 977/742–754, 977/842–848
See application file for complete search history.

(56) References Cited

U.S. PATENT DOCUMENTS

| | | | |
|---|---|---|---|
| 6,891,227 B2 | 5/2005 | Appenzeller et al. | |
| 2003/0211724 A1* | 11/2003 | Haase .................... | B82Y 10/00 438/629 |
| 2004/0253805 A1 | 12/2004 | Dubin et al. | |

FOREIGN PATENT DOCUMENTS

| | | |
|---|---|---|
| JP | 2002-167671 A | 6/2002 |
| JP | 2002-329723 A | 11/2002 |
| JP | 2004-6864 A | 1/2004 |

OTHER PUBLICATIONS

Makino, et al., Size classification of Si nanoparticles formed by pulsed laser ablation in helium background gas, Appl. Phys. A 1999; 69: S243-S247.*

Ahn, et al., Gated Carbon Nanotube Emitters Grown on Silicon Trench Wells With a Sidewall Spacer for Stable Vacuum Microwave Devices, Vacuum Microelectronics Conference, 2001 IVMC 2001. Proceedings of the 14th International, pp. 55-56 (2001).*

Friedlander, et al. Elasticity of nanoparticle chain aggregates: implications for polymer fillers and surface coatings, Powder Technology 2001; 118: 90-96.*

Soh et al., "Integrated nanotube circuits: Controlled growth and ohmic contacting of single-walled carbon nantubes", Applied Physics Letters 1999; vol. 75, No. 5, pp. 627-629.

Derycke et al., "Carbon Nanotube Inter- and Intramolecular Logic Gates", Nano Letters 2001; vol. 1 No. 9, pp. 453-456.

Brandow, et al., Size-controlled colloidal Pd(II) catalysts for electroless Ni deposition in nanolithography applications, J. Electrochem. Soc. 1997; 10(144): 3425-3434.

Dai et al., "Single-wall nanotubes produced by metal-catalyzed disproportionation of carbon monoxide", Chemical Physics Letters 1996, vol. 260, pp. 471-475.

Zhang et al., "Electric-field-directed growth of aligned single-walled carbon nanontubes", Applied Physics Letter 2001; vol. 79, No. 19; pp. 3155-3157.

Seto, et al., "Fabrication of silicon nanostructured films by deposition of size-selected nanoparticles generated by pulsed laser ablation", Thin Solid Films 2003; 437: 230-234.

Makino, et al., "Size classification of Si nanoparticles formed by pulsed laser ablation in helium background gas", Appl. Phys. A; 1999; 69: S243-S247.

Ahn et al., "Gated carbon nanotube emitters grown on silicon trench wells with a sidewall spacer for stable vacuum microwave devices", Vacuum Microelectronics Conference, 2001. IVMC 2001, Proceedings of the 14th International, pp. 55-56 (2001).

Japanese Office Action mailed Jul. 22 ,2008; corresponding in Japanese Application No. 2003-298337, with English translation (3 pages).

Matsumoto et al., "Single Electron Transistor with Ultra-High Coulomb Energy of 5000K using Position Controlled Grown Carbon Nanotube as Channel", Extended Abstracts of the 2002 International Conferences on Solid State Devices and Materials, Nagoya, 2002, pp. 92-9.3.

Nihei et al., "Selective growth of vertically aligned carbon nanotubes (CNTs) in via holes for advanced ULSI interconnection", p. 1.

Yamamoto et al., "Initial Deposition Behavior of Electroless Nickel on Glass Substrate" with English Language Abstract, pp. 34-39.

Eppler, et al., "Model Catalysts Fabricated Using Electron Beam Lithography and Pulsed Laser Deposition", J. Phys Chem. B, 1997, 9973-9977.

Sato, et al., "Growth of diameter-controlled carbon nanotubes using monodisperse nickel nanoperticles obtained with a differential mobility analyzer", Chem. Phys. Ltr. 382, 2003 361-366.

Makino, et al., "Size classification of Si nanoparticles formed by pulsed laser ablation in helium background gas", Appl. Phys. A; 69: 1999; S243-S247.

Zhang et al., "Elected-fieldO-directed growth of aligned single-walled carbon nanontubes", Applied Physics Letter 2001; vol. 79, No. 19; pp. 3155-3157.

Makino, et al., "Size classification of Si nanoparticles formed by pulsed laser ablation in helium background gas", Appl. Phys. A; 1999; 69: 5243-5247.

* cited by examiner

⊢—⊣ 100nm

⊢—⊣ 100nm

FORMING METHOD AND FORMING APPARATUS OF CARBON NANOTUBES

CROSS-REFERENCE TO RELATED APPLICATIONS

This application is a continuation of U.S. application Ser. No. 13/705,778, filed on Dec. 5, 2012, now U.S. Pat No. 9,017,636, which is a division of U.S. application Ser. No. 12/732,939, filed on Mar. 26, 2010, now abandoned, which is a division of U.S. application Ser. No. 10/874,392, filed on Jun. 24, 2004, now abandoned, which is based upon and claims the benefit of priority from Japanese Patent Application No. 2003-187331, filed on Jun. 30, 2003, and Japanese Patent Application No. 2003-298337, filed on Aug. 22, 2003, the entire contents of which are hereby incorporated by reference.

BACKGROUND OF THE INVENTION

1. Field of the Invention

The present invention relates to a deposition method and a deposition apparatus of fine particles such as nano-particles having diameters less than about 30 to 90 nm, and a forming method and a forming apparatus of carbon nanotubes by using the fine particles as catalysts.

Furthermore, the present invention relates to semiconductor devices having a channel or wires for which carbon nanotubes are used and manufacturing methods of the same, and more particularly, to a semiconductor device having a carbon nanotube which has good controllability of sizes and a manufacturing method of the same.

2. Description of the Related Art

Attempts have been made to manufacture a thin film or a semiconductor device by piling fine particles, particularly nano-particles, on a substrate, which has a different property from a conventional thin film or device. For example, attempts have been made to deposit silicon particles on a gate insulating film of a MOS transistor so that a floating gate has a low leakage. Several methods for depositing these particles exists. For example, there is a method whereby gas (aerosol) including particles (aerosol) is sprayed so that the particles are deposited on the substrate by diffusion or inertia. There also is a method whereby particles are deposited in a temperature gradient by thermophoresis. There also is a method whereby particles are charged in advance and then deposited by using an electrical field, or the like.

Nano-particles can be used as catalysts for formation of carbon nanotubes, which are self-organizing materials. Lately, attempts are being made to apply the carbon nanotubes to various fields because of good electrical, thermal and mechanical properties. Since characteristics of the carbon nanotubes vary in terms of their diameters, chiralities, the number of layers, or the like, it is important to control these characteristics for various applications.

Recent reports indicate that the diameters of the carbon nanotubes are controlled by the size of catalyst particles. In particular, particles are generated by a liquid phase process such as a reversed micelle method. This is followed by particle suspension whereby particles are dropped and dried on the substrate, and then CVD. As a result, carbon nanotubes can be grown on the substrate while controlling their diameters. Reports also indicate that carbon nanotubes can be grown after an aqueous solution of ferritins containing iron oxide is provided on a substrate.

The carbon nanotube has a cylinder-shaped configuration wherein a surface piece (graphene sheet) of graphite is wound. The diameter of the carbon nanotube is in a range of approximately 3 to 9 nm to 30 to 90 nm and the length of the carbon 1.0 nanotube is approximately 3 to 9 μm. Hence, the aspect ratio (length/diameter) is approximately 1000. Therefore, a one-dimensional electronic characteristic due to such configuration anisotrophy is observed.

An example of an electronics application of the carbon nanotube the wiring of an LSI (large scale integrated circuit). The maximum electric current density of the carbon nanotube where an electric current can flow without causing snapping (breaking) is one billion amperes per one square centimeter, which is more than 1000 times as much as copper wiring. In addition, the thermal conductivity is ten times as high as copper.

With respect to the carbon nanotube, ballistic electron transport can be realized without scattering phenomena caused by impurities and lattice vibration. In this case, it is known that the resistance per one carbon nanotube is approximately 6.45 k$\Omega$. Furthermore, the diameter of the carbon nanotube has a wide range of approximately 0.4 nm to 100 nm. The diameter is formed in a self-organized manner, and therefore changes in diameter in a longitudinal direction are extremely small. Because of the above discussed characteristics, the electromigration due to a high electric current density in a case where the carbon nanotube is applied as wiring of the LSI is small. Therefore, it is expected that extremely minute metal wirings having high reliability can be realized.

Another example of an electronics application of the carbon nanotube is to the channel of a transistor. It is expected that, with the carbon nanotube, abilities in driving electric current will be considerably improved because of the ballistic electron transport and an extremely large electric current density the carbon nanotube can sustain.

As briefly mentioned above, general growth methods of carbon nanotubes, such as the arc discharging method, the laser ablation method (laser evaporation method), the CVD method, the SiC sublimation method, or the like, are known. In such methods, at the time when the carbon nanotube is formed, transition metals are used as catalyst metals. In the CVD method or SiC sublimation method, the transition metal is positioned and formed in advance by using lithography and a vacuum evaporation method used for a semiconductor LSI, so that the carbon nanotubes are selectively grown by performing position controlling.

However, the above mentioned conventional methods have the following problems.

First, although the above mentioned art is useful for piling the particles on the plane substrate, it is difficult to deposit the particles on the bottom part of the groove having a high aspect ratio, which is formed on the substrate with a size on the order of a micron or less. More particularly, as shown in FIG. 1, due to diffusion of the particles 301, the particles 301 are unevenly distributed and deposited at an entering part of a groove forming part 302. Because of this, it is difficult to lead the particles 301 to a bottom part 303. This tendency frequently occurs when making the sizes of the particles smaller. For example, this causes a big problem when the catalyst particles are deposited on the bottom part of the via hole in a case where the carbon nanotubes are applied as a via wiring of the semiconductor.

Furthermore, in the above discussed methods for forming carbon nanotubes, the formation of the particles or preparation of a suspension is generally performed outside of a CVD chamber by manual means. Hence, various impurities may get easily mixed in. Furthermore, it is necessary to add a surface active agent in order to keep particles generated in the liquid phase in a stable suspension. In many examples, therefore, impurities are substantially included when the particles are provided on the substrate. In addition, it is difficult to avoid exposing a surface of the particles to the air and such impurities. Hence, it is difficult to generate particles having stable compositions.

The above mentioned impurities on the substrate and unstableness of the composition of the particles may cause problems in growing carbon nanotubes and controlling their diameters. In addition, since the above mentioned process is a process substantially and easily exposed to the air, the surface of the substrate is easily oxidized and electric contact between the carbon nanotube after the growth and the substrate becomes worse. Hence, it is difficult to apply the carbon nanotube to electric applications.

Thus, it is difficult to apply a conventional forming technology of the nano-particles to a process requiring a precise control of the carbon nanotube growth. In addition, there are still a lot of problems in controlling the growth of the carbon nanotubes.

There also is a method in the related art wherein carbon nanotubes are used for connecting wiring layers of an LSI having a multilayer interconnection structure. FIG. 2-(A) shows a multilayer interconnection structure wherein an upper wiring layer 103 is provided over a lower wiring layer 101 via an interlayer insulating layer 102. Carbon nanotubes 105 are formed in a via hole forming part 104 so that the upper wiring layer 103 and the lower wiring layer 101 are electrically connected. Under the above mentioned structure, a catalyst metal layer 106 is formed on a surface of the lower wiring layer 101 of the via hole forming part 104. Carbon nanotubes are formed by using the catalyst metal layer 106 as a nucleus with a thermal CVD method.

However, the LSI has a tendency to become more and more integrated based on the scaling rule, and therefore it is expected that the opening width of a via hole forming part will continue to get narrower and the aspect ratio of the via hole forming part will continue to get larger. Even if it is attempted to form the catalyst metal layer 106 on the bottom of the narrower via hole forming part 104 by the spattering method or vapor deposition method, the catalyst metal layer 106 is adhered on not only the bottom of the via hole forming part 104 but also a side wall, as shown in FIG. 2-(B). As a result of this, a carbon nanotube is grown from the catalyst metal layer 106A adhered on the side wall. This causes a problem in that the upper wiring layer 103 and the lower wiring layer 101 are not electrically connected. On the other hand, there is an electric plating method whereby the catalyst metal layer is formed. However, in this method, as shown in FIG. 2-(C), as the opening part of the via hole forming part 104 is narrower, a film width distribution based on an electric current density distribution caused by added voltage is more remarkable. Therefore, the film of a bottom center part 104A of the via hole forming part 104 becomes thin and a film of a vicinity part 104B becomes thick. This causes an increase in the via resistance of the catalyst metal layer 106B to thickly adhere the catalyst metal to the vicinity part 104B.

Furthermore, the catalyst metal layer formed by the spattering method, vacuum vapor deposition, or electric plating method, is a continuous layer having a small surface roughness. A bundle of the carbon nanotubes grown from such a catalyst metal layer has unevenness of internal diameters and external diameters. As the via hole forming part is narrowed and the number of the carbon nanotubes contributing to electric conductivity is reduced, unevenness of the via resistance becomes larger. As a result, a problem such as wiring delay may occur in a case where the via forming part has a large via resistance. Furthermore, in a case of the LSI having a lot of transistors wherein carbon nanotubes are used as a channel, unevenness of an electric current driving ability between the transistors occurs due to the unevenness of the internal and external diameters of the carbon nanotubes. This causes a problem in that the capabilities of the entire LSI are reduced.

SUMMARY OF THE INVENTION

Accordingly, it is a general object of the present invention to provide a novel and useful deposition method and deposition apparatus of fine particles, and forming method and forming apparatus of carbon nanotubes, in which one or more of the problems described above are eliminated.

Another and more specific object of the present invention is to provide a deposition method and deposition apparatus whereby particles can be deposited substantially on only a bottom part of a groove structure having a high aspect ratio, for example, only a bottom part of a via hole of a semiconductor wire, as well as a plane part.

Furthermore, it is also an object of the present invention to provide a forming method and forming apparatus of a carbon nanotube whereby a carbon nanotube is grown in the groove structure with precise controllability by using the deposited particles as catalysts.

In addition, it is also an object of the present invention to provide a forming method and forming apparatus of a carbon nanotube whereby a carbon nanotube is grown under a clean condition where a deposition condition of the particle and a surface condition of a substrate are controlled, so that it is possible to easily perform control of the growth of the carbon nanotube and its electrical application.

The above objects of the present invention are achieved by a deposition method of fine particles, including the steps of:

irradiating a fine particle beam formed by size-classified fine particles to an irradiated subject under a vacuum state, and depositing the fine particles on a bottom part of a groove structure formed at the irradiated subject.

The above objects of the present invention are achieved by a deposition method of fine particles, including the steps of:

generating the fine particles, size-classifying the fine particles to a desired fine diameter, and irradiating a fine particle beam formed by the size-classified fine particles to a irradiated subject under a vacuum state.

The above objects of the present invention are achieved by a deposition apparatus of fine particles, including:

a generating part configured to generate fine particles, a classifying part configured to size-classify the fine particles to a desired fine diameter, and an irradiating part configured to irradiate a fine particle beam formed by the fine particles having desired particle diameters to an irradiated subject under a vacuum state.

The above objects of the present invention are achieved by a forming method of carbon nanotubes, comprising the steps of:

irradiating a fine particle beam formed by size-classified catalyst fine particles to an irradiated subject under a vacuum state, depositing the fine particles on a bottom part of a groove structure formed at the irradiated subject, and generating a carbon nanotube from the bottom part by using the catalyst fine particles as catalysts.

The above objects of the present invention are achieved by a forming method of carbon nanotubes, including the steps of:

generating catalyst fine particles, size-classifying the catalyst fine particles to desired fine diameters, irradiating a fine particle beam formed by the size-classified catalyst fine particles to an irradiated subject under a vacuum state, so that the catalyst fine particles are deposited on a bottom part of a groove structure formed at the irradiated subject, and generating a carbon nanotube from the bottom part by using one of the catalyst fine particles as a catalyst.

The above objects of the present invention are achieved by a forming method of carbon nanotubes, comprising the steps of:

generating catalyst fine particles, depositing the catalyst fine particles on a substrate, and generating the carbon nanotube by using one of the catalyst fine particles as a catalyst, wherein each step is continuously performed under a designated environment cut off from the outside.

The above objects of the present invention are achieved by a forming apparatus of carbon nanotubes, including:

a fine particle generation part configured to generate fine particles, a deposition part configured to deposit the catalyst fine particles on a substrate, and a tube generation part configured to generate a carbon nanotube by using one of the catalyst fine particles as a catalyst, wherein a series of processes from generation of the catalyst fine particles to generation of the carbon nanotubes is continuously performed under a designated environment cut off from the outside.

It is also a general object of the present invention to provide a novel and useful semiconductor device and manufacturing method of the same, in which one or more of the problems described above are eliminated.

Another and more specific object of the present invention is to provide a highly reliable semiconductor device whereby the resistance of a perpendicular wiring part, such as a contact or via having a high aspect ratio, and unevenness of the resistance can be reduced, and manufacturing the same. It is also an object of the present invention to provide a highly reliable semiconductor device whereby it is possible to make the size of the semiconductor device small, reduce unevenness of a property of the semiconductor device, provide high performance by the semiconductor device, and manufacturing of the same.

The above objects of the present invention are achieved by a semiconductor device, including:

a first conductive part;

an interlayer insulating layer which covers the first conductive part;

a second conductive part which is formed on the interlayer insulating layer;

a groove part which pierces the inter layer insulating layer and exposes the first conductive layer;

wherein the groove part includes a catalyst layer and a carbon nanotube, the catalyst layer is formed on a surface of the first conductive part, and the carbon nanotube is formed on the catalyst layer and electrically connects the first conductive layer and the second conductive layer; and the catalyst layer is formed by fine particles.

According to the above mentioned invention, the carbon nanotube is provided at the groove part for connecting the first conductive part and the second conductive part. The carbon nanotube is formed by being grown from the catalyst layer formed by a fine particle formed at a surface of the first conductive part. Hence, corresponding to a configuration and distribution of the fine particles, it is possible to control the internal diameter, the external diameter, or the density of a distribution in the horizontal direction of the carbon nanotubes. Compared to a catalyst layer formed by a conventional consecutive film, it is possible to improve controllability of a measurement or distribution of the carbon nanotubes by providing the fine particles that become a growth core of the carbon nanotubes. Hence, it is possible to realize a highly reliable semiconductor device whereby the resistance of a perpendicular wiring part such as a contact or via having a high aspect ratio can be reduced.

The above object of the present invention is achieved by a semiconductor device, including:

a substrate;

an insulating layer formed on a main surface of the substrate;

two catalyst layers formed on the insulating layer isolated from each other;

a carbon nanotube formed between the two catalyst layers;

a first conductive part and a second conductive part each of which covers a separate one of the catalyst layers; and a third conductive part formed on a back surface of the substrate, wherein an electric current flowing in the carbon nanotube is controlled by an electric voltage and an electric current applied to the third conductive part, and each of the catalyst layers is formed by a fine particles.

According to the above mentioned invention, corresponding to an electric field applied from the third conductive part via the insulating layer, electric conductivity of the carbon nanotube for connecting the first conductive part and the second conductive part is changed, so as to function as a transistor. In addition, the carbon nanotube is formed by being grown from the catalyst layer formed by a fine particle. Hence, corresponding to a configuration and distribution of the fine particles, it is possible to control the diameter or the density of a distribution in the horizontal direction of the carbon nanotubes. Therefore, it is possible to reduce unevenness of a property of the transistor, and therefore it is possible to realize a highly reliable semiconductor device having a high ability and a lot of transistors such as an LSI.

The above object of the present invention is achieved by a manufacturing method of a semiconductor device, the semiconductor device including a first conductive part and a second conductive part which are provided separated from each other, the method comprising the steps of:

forming a catalyst layer, which is formed by fine particles, on at least one of the first conductive part and the second conductive part;

forming a carbon nanotube which electrically connects the first conductive part and the second conductive part by using one of the fine particles as a catalyst.

According to the above mentioned invention, the carbon nanotube is provided as the wiring for connecting the first conductive part and the second conductive part. The catalyst layer formed by a fine particle is formed in advance between the first conductive part and the second conductive part. The carbon nanotube is formed by being grown from the fine particle. Hence, corresponding to a configuration and distribution of the fine particles, it is possible to control the internal diameter, the external diameter, or the density of a distribution of the carbon nanotubes. As a result of this, it is possible to provide a highly reliable semiconductor device whereby it is possible to reduce unevenness of properties of a horizontal wiring part and an active element.

In the step of forming the catalyst layer, the catalyst layer may be formed by an electroless plating process.

In an electroless plating method, it is possible to selectively form the catalyst layer on a surface of the insulating layer or a bottom part of the via hole, and therefore the catalyst layer can be made by an aggregate of the fine particle.

Other objects, features, and advantages of the present invention will become more apparent from the following detailed description when read in conjunction with the accompanying drawings.

DETAILED DESCRIPTION OF THE PREFERRED EMBODIMENTS

A description will now be given, with reference to FIG. 3 through FIG. 21, of embodiments of the present invention.

[First Embodiment]

Figure 1:
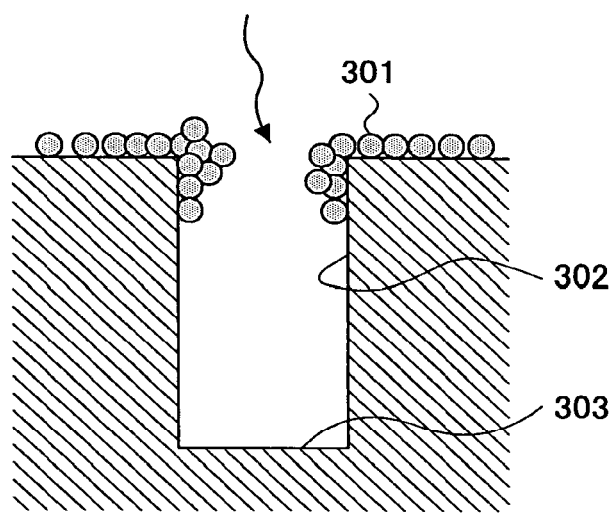
FIG. 1 is a schematic cross-sectional view showing a state of the related art where particles are deposited on a groove structure having a high aspect ratio.
Figure 2:
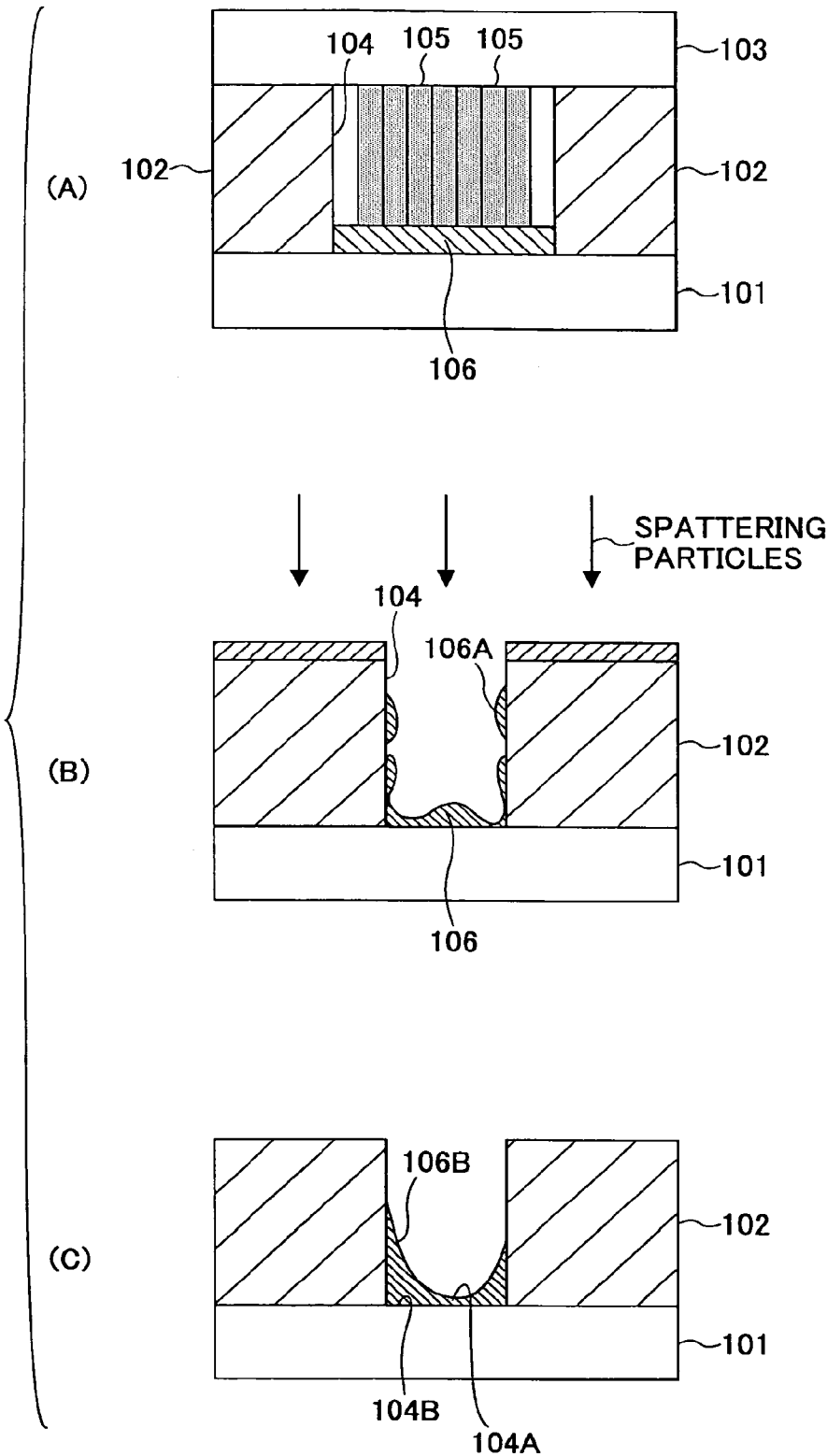
FIG. 2 is a view showing problems of a related art wire structure.
Figure 3:
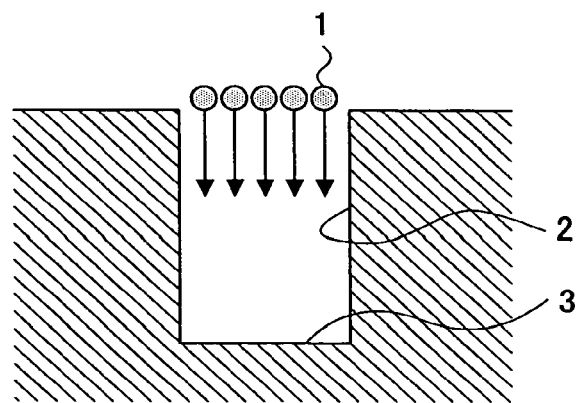
FIG. 3 is a schematic cross-sectional view showing a state of a first embodiment where particles are deposited on a bottom part of a groove structure having a high aspect ratio.

In order to deposit particles substantially on the bottom part in a groove structure having a high aspect ratio, such as the structure shown in FIG. 3, particles 1 having the same moving direction may be led to a bottom part 3 of a groove structure 2 having a high aspect ratio. In this case, it is necessary to form a particle beam wherein directions of particles are arranged in advance so as to have high directivities; and minimize disturbance, namely diffusion, of the particle direction due to a collision of gas molecules.

The groove structure having a high aspect ratio is assumed with a depth/width that is more than 1/1; that is, the depth is larger than the width, and the width is less than approximately 2 μm calculated under assumption that a particle size is approximately 20 nm.

Figure 4:
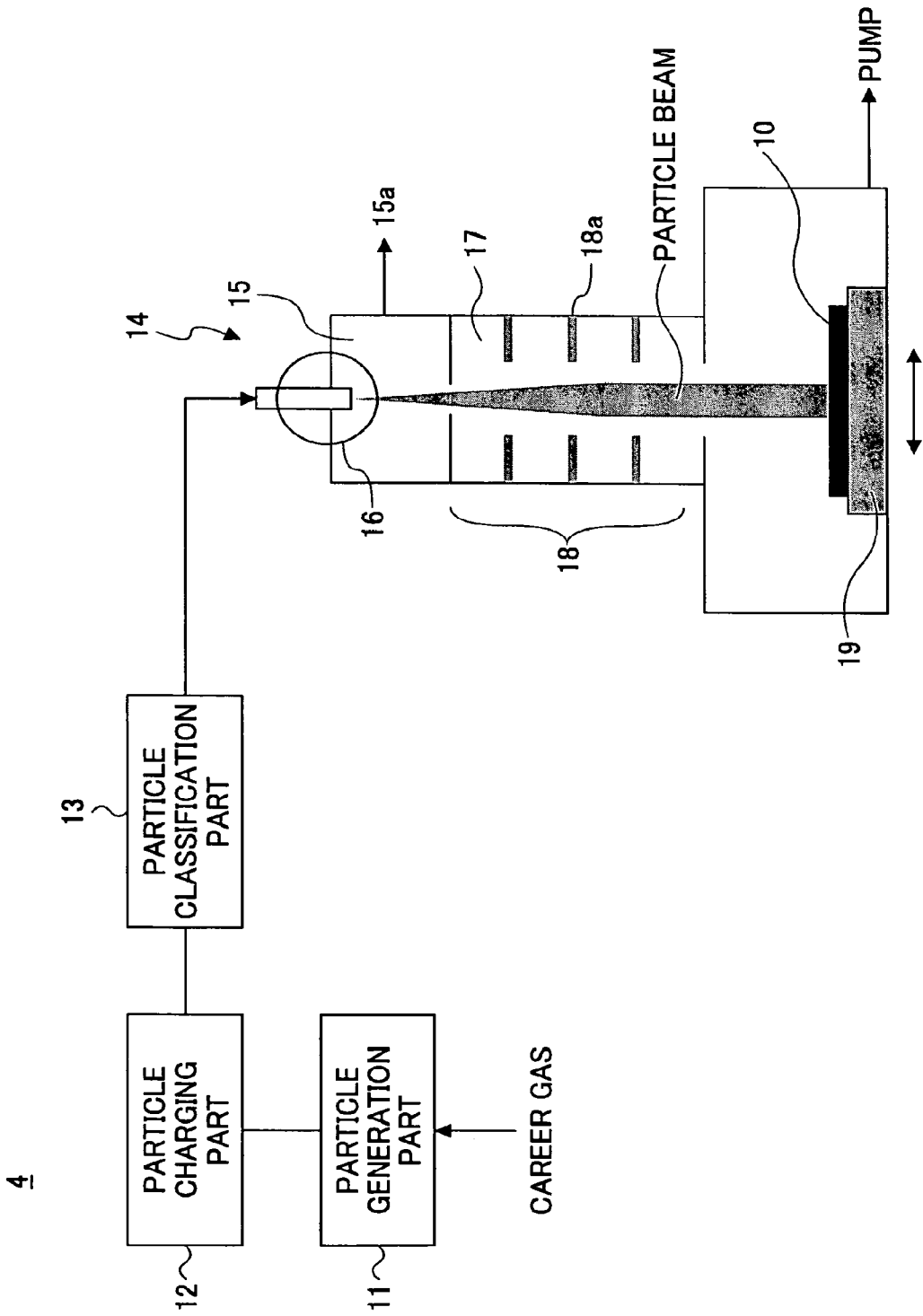
FIG. 4 is a schematic view showing a schematic structure of a particle deposition apparatus of the first embodiment of the present invention.

More specifically, a deposition apparatus such as shown in FIG. 4 may be used. The deposition apparatus 4 includes a particle generation part 11, a particle charging part 12 for charging the generated particles, a particle classification part 13 for classifying the particles to designated sizes, and a deposition chamber 14 where a particle beam is irradiated and particles are deposited.

The deposition chamber 14 includes a vacuum part 15, a nozzle 16, a high vacuum part 17, a particle convergence part 18, a movable stage 19, and other components. The nozzle 16 leads the particles to the vacuum part 15. The vacuum part 15 has a pressure of approximately 10Pa, for example. The high vacuum part 17 has a pressure of approximately $10^{-4}$Pa, for example. The direction of the particle beam is arranged by the particle convergence part 18. A substrate 10 which is the subject of irradiation is provided on the movable stage 19.

The particles are generated by the particle generation part 11 based on laser ablation, an evaporation-condensation method, or the like, and then led to the particle charging part 12 by carrier gas such as helium. The particles are charged by the particle charging part 12 based on a method using radiation rays, a method using ultraviolet rays, or the like. The sizes of the charged particles are arranged and classified by the particle classification part 13 such as a DMA (Differential Mobility Analyzer) if necessary, and then the particles are led to the deposition chamber 14 with carrier gas.

The carrier gas containing the particles is led to the deposition chamber 14 via the nozzle 16. The nozzle 16 has a pore (orifice) or a capillary. The particles led to the vacuum part 15 are led to the high vacuum part 17 by a differential vacuum pump 15a having one stage or multi-stages. At this time, only the carrier gas is led to the differential vacuum pump 15a due to the inertia of the particles. The particles led to the high vacuum part 17 have relatively wide distribution in position due to an influence of the carrier gas. The particles are led to an electrostatic lens 18a of the particle convergence part 18 so as to be included in a particle beam wherein the directions of the particles are arranged by a convergence effect of the electrostatic lens 18a.

In the electrostatic lens 18a shown in FIG. 4, three circular plates having holes are arranged in series. Different electric potentials are provided to the respective circular plates. By selecting suitable electric potentials, it is possible to converge the charged particles. It is also possible to increase or decrease the number of the circular plates having holes based on conditions. If necessary, it is possible to increase or decrease the speed of the particles by using these lenses. In addition to using the above mentioned electrostatic lens to converge particles, it is also possible to use an aerodynamic lens.

A particle beam having high directivity wherein the directions of the particles are arranged is irradiated to the substrate 10. The substrate 10 has a groove structure having a high aspect ratio, and is fixed on the movable stage 19. Since the particle beam is provided in a high vacuum state, there is little disturbance due to gas molecules. For example, assuming that the pressure is approximately $10^{-4}$Pa, helium gas is used as the carrier gas, and the particles have diameters of approximately 5 nm, the particles have mean free paths of approximately 36 cm. That is, if the flight distance of the particle is set so as to be less than the above mentioned mean free path, it is possible to ignore the disturbance due to the gas molecules. As a result of this, the particles can maintain directions provided by the particle convergence part 18 so as to be deposited on substantially a bottom part of the groove structure having the high aspect ratio.

The particle beam leading to the bottom part of the groove structure has an extremely high speed such as 1000 m/s in a normal state due to acceleration by the vacuum part 15 or the electrostatic lens 18a. The particle beam may recoil from the bottom part. The substrate temperature may be decreased in order to effectively ease such recoil. For this reason, a temperature adjustment mechanism may be provided at the movable stage 19.

Meanwhile, in order to form carbon nanotubes in a state where the particles and surface state of the substrate are controlled, particles as catalysts are generated under a vacuum state or an inactive gas environment and the particles are deposited on the substrate under a similar environment to that without using a solvent, so that the carbon nanotubes are grown. That is, it is preferable that a series of steps of generating the particles, depositing the particles on the substrate, and growing the carbon nanotubes be performed continuously under a designated environment cut off from the outside.

Figure 5:
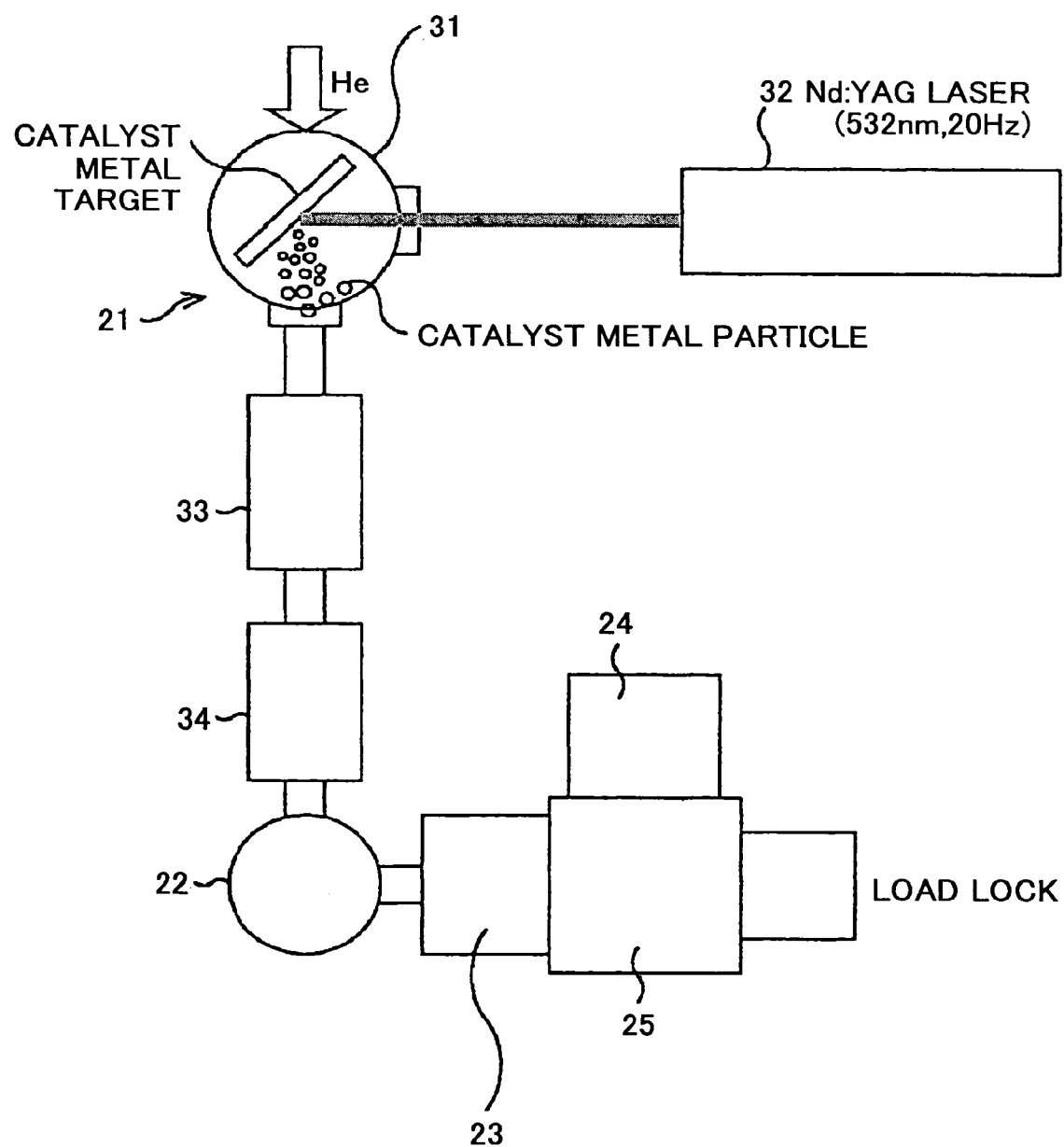
FIG. 5 is a schematic view showing a schematic structure of a forming apparatus of a carbon nanotube of the first embodiment of the present invention.

A schematic structure of a forming apparatus of the carbon nanotube whereby the above described continuous steps are performed is shown in FIG. 5.

This forming apparatus includes a particle generation part 21, a classification part 22, a particle deposition part (deposition chamber) 23, and a tube generation part (CVD chamber) 24. Particles used as catalysts are generated by the particle generation part 21. The generated particles are classified to designated particle diameters by the classification part 22. The particles are deposited on the substrate by the particle deposition part (deposition chamber) 23. The carbon nanotubes are generated with the tube generation part (CVD chamber) 24 by using the deposited particles as catalysts. Under the above mentioned structure, a continuous process from generation of the particles to generation of the carbon nanotubes is performed continuously under a designated environment cut off from the outside.

For the generation of the carbon nanotubes, first the particles are generated by a laser ablation at the generation chamber 31 of the particle generation part 21. The generation chamber 31 has a low pressure helium gas environment. As a laser, for example, an Nd:YAG pulse laser 32 having a second harmonic frequency (532 nm, 20 Hz) is used. As a target of the ablation, a catalyst metal, such as nickel, iron, cobalt, or its alloy is selected. The catalyst metal changes to vapor due to the laser irradiation. The vapor is cooled by the helium gas that is the carrier gas so that the particles are formed. It is also possible to generate the particles by using not only the above mentioned laser ablation but also a generally known evaporation-condensation method.

Next, the particles are annealed by an electric furnace 33 and then led to the charging apparatus 34. The particles are charged positively or negatively by a corona charging apparatus, for example, of the charging apparatus 34, and then led to the classification apparatus 22. As the charging apparatus, an apparatus using a radioactive source or ultraviolet rays may be used. The above described charging process may be performed prior to the annealing process. In the classification apparatus 22, the particles are classified by a differential mobility analyzer (DMA) so that monodispersed particles having diameters of nano order (less than approximately 1.2 of a geometric standard deviation) can be obtained. The classification of the particles can be performed by using not only the above mentioned differential mobility analyzer but also an impaction device or virtual impaction device, for example.

Figure 6:
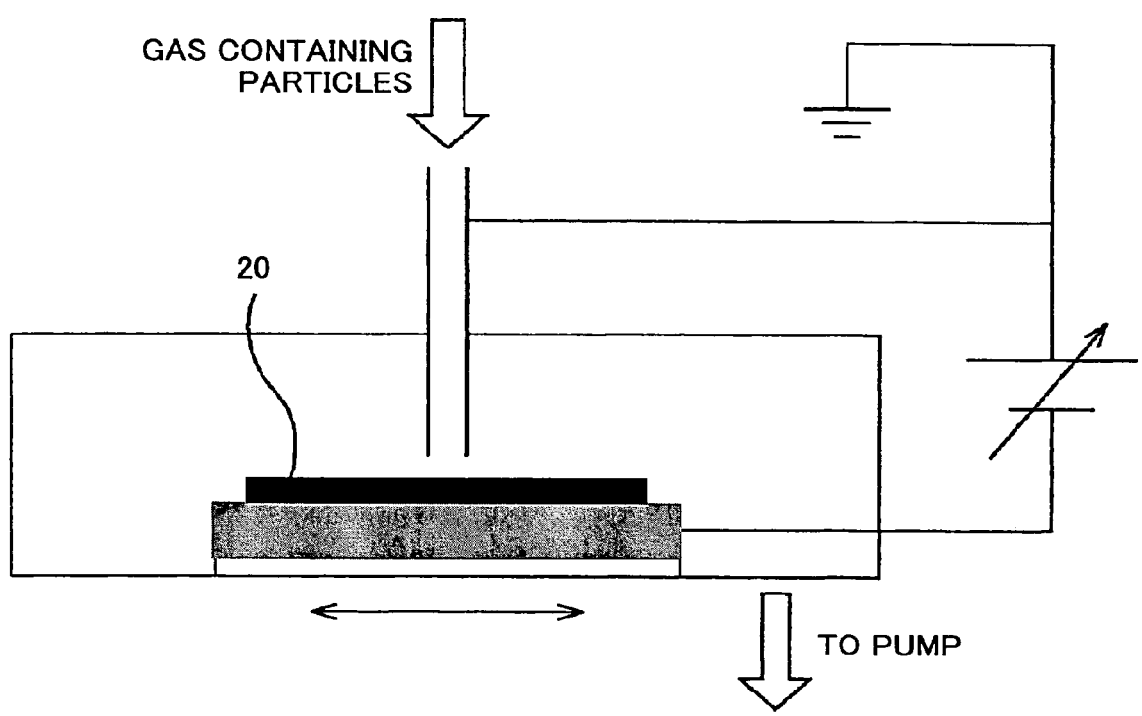
FIG. 6 is a schematic view showing a schematic structure of a deposition chamber of the first embodiment of the present invention.

Then, the particles are led to the deposition chamber 23. Before that, a coating process for the particles may be performed by making the particles go through a supersaturated vapor of a material. The classified or classified and coated, particles are deposited on the substrate 20 by the deposition chamber 23. FIG. 6 shows a schematic structure of the deposition chamber 23. The particles are led to the substrate by an electrostatic force, an inertial effect, diffusion, or the like. Especially, approximately 100% of the particles may be deposited on the substrate 20 with an electrostatic force by adding a bias to the substrate 20. At this time, it is possible to deposit particles on only a desired position by patterning on the substrate 20 with a photoresist.

After the deposition of the particles, the substrate 20 is led to the CVD chamber 24 via the vacuum transfer chamber 25. The deposition chamber may be used as the CVD chamber. In the CVD chamber 24, the carbon nanotubes are generated based on the catalyst particles. As a reaction gas, generally, a material containing carbon such as methane, acetylene, or alcohol, may be used. However, as long as the catalyst particles contain carbon in advance, another gas may be used.

Thus, in the first embodiment, the process from generation of the catalyst to generation of the carbon nanotube is continuously performed in a vacuum state or an inactive gas. Hence, it is possible to easily generate the catalyst particles and control the surface state and an impurity. In conventional thin film making, a hydrogen treatment is performed before the CVD so as to eliminate an oxidation layer of the surface. In the case of the catalyst particles, since the particles have a large surface area and a complicated surface structure, the problem of whether such a conventional process is effective provides motivation to make the present invention.

[First Example of First Embodiment]

Next, a first example of the first embodiment of a deposition method is explained. In addition, a deposition apparatus of fine particles, and a forming method and a forming apparatus of carbon nanotubes, are explained.

More specifically, in the first example, a deposition apparatus and method whereby particles are deposited substantially on a bottom part of a groove structure having a high aspect ratio such as a via hole forming part of a semiconductor wiring, and a method for growing carbon nanotubes by using the deposited particles as catalysts, are described.

Figure 7:
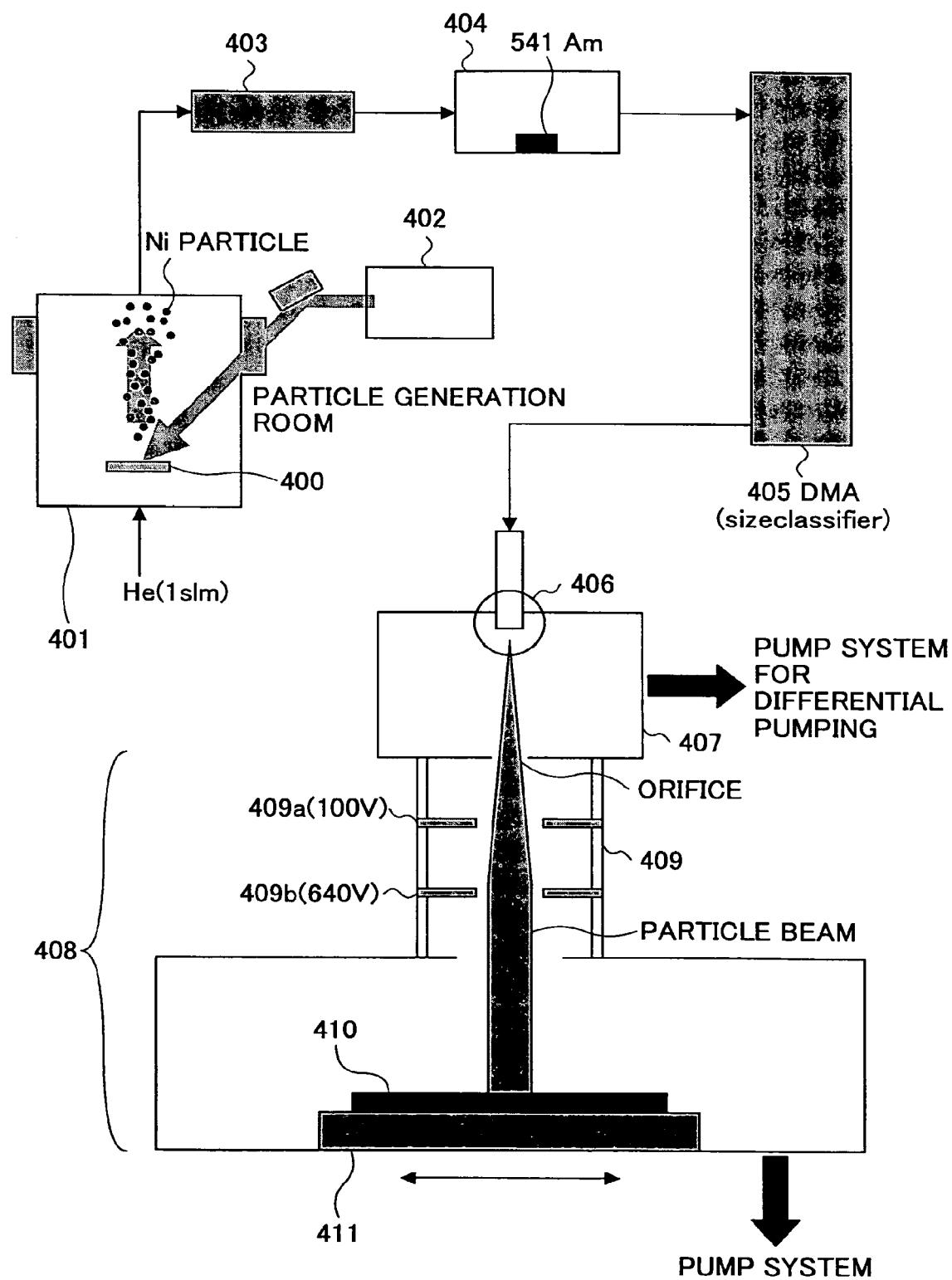
FIG. 7 is a schematic view showing a schematic structure of a particle deposition apparatus of a first example of the first embodiment of the present invention.

FIG. 7 is a schematic view showing a schematic structure of a particle deposition apparatus of the first example of the first embodiment of the present invention. Nickel (Ni), Iron (Fe), Cobalt (Co), or the like is suitable as a catalyst particle. In this example, the Ni particle is used as the catalyst particle.

In this example, the particles are generated by using laser ablation. A Ni substrate 400 is provided in a particle generation chamber 401 having a pressure of approximately $3 \times 10^3$Pa. The Ni substrate 400 is irradiated by a laser beam from the pulsed laser 402 (a second harmonic Nd:YAG laser having a repeated frequency 20 Hz, and a wave length of 532 nm) so that vapor is generated. This vapor is cooled by helium (He) having approximately 99.99995% purity and a flow rate of 1SLPM (standard liter per minute) so that Ni particles (nano-particles) are generated by nucleation.

Next, the generated Ni particles are annealed at approximately 800° C., for example, by a tube-shaped electric furnace 403. And then, the Ni particles are charged by a radioactive source of americium 241 ($^{241}$Am) at a charging apparatus 404 and classified by a DMA (Differential Mobility Analyzer) 405 so that the sizes of the Ni particles are arranged.

Figure 8:
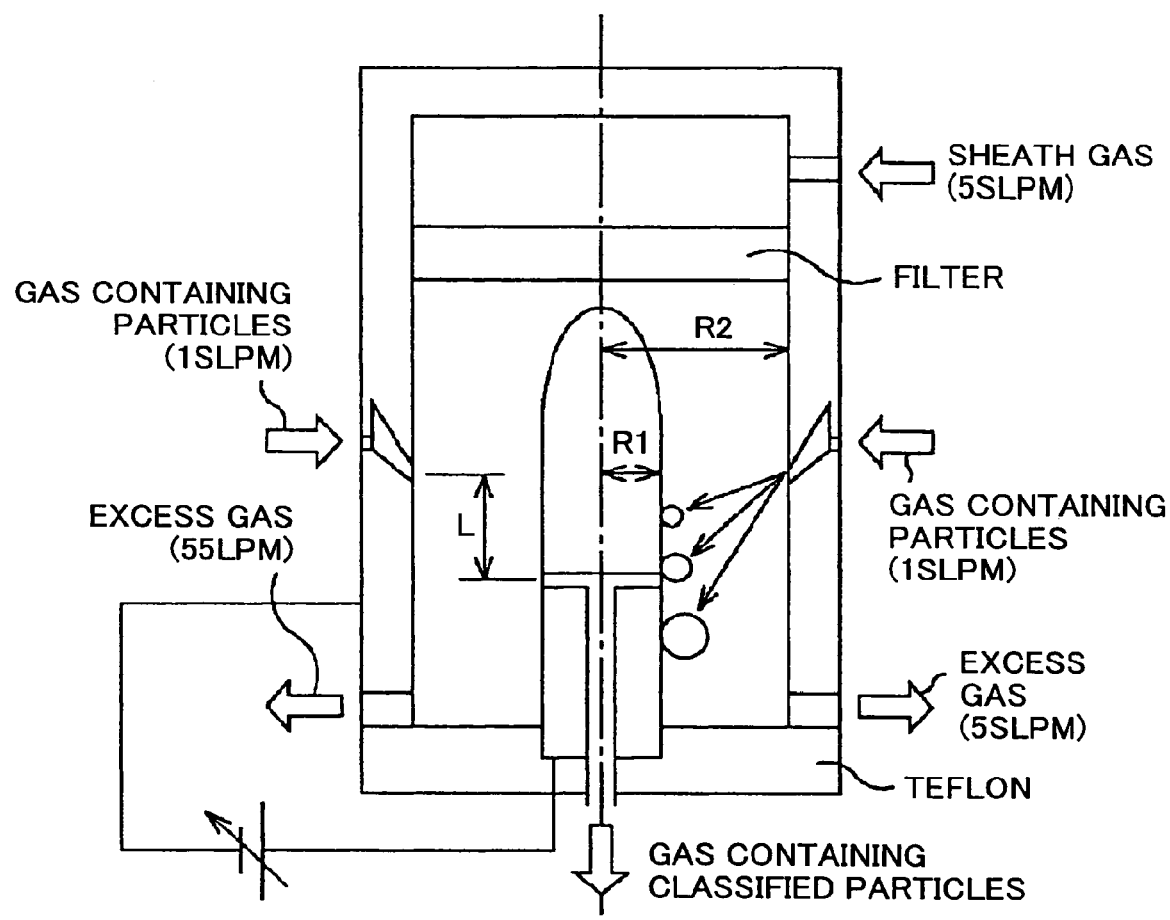
FIG. 8 is a schematic view showing a schematic structure of a DMA (Differential Mobility Analyzer) of the first example of the first embodiment of the present invention.

As shown in FIG. 8, the DMA 405 has a double cylinder structure. A voltage is added to the inside of the DMA 405. The DMA 405 has an internal pipe having an external radius R1 of 11 mm and an external pipe having an external radius R2 of 18 mm. Particles led from an upper part slit of the external pipe are pulled to the internal pipe in gas flowing between the pipes, depending on an electrical mobility, namely a size. Only a particle having a certain electrical mobility passes through a slit in the lower part of the internal pipe (in this example, the distance L between the upper and lower slits is 210 nm). A necessary voltage against a particle having a diameter of 7 nm is approximately 2.7V when a flow rate of the sheath gas is 5SLPM, and the flow rate of the gas containing the particles is 1SLPM. Other particles are caught by a filter in the lower part of the DMA.

The Ni particles whose size is arranged by the DMA 405 are led to a low pressure vacuum room 407 via the orifice (nozzle) 406. The vacuum room 407 has approximately 10Pa and the diameter of the orifice 406 is approximately 1 mm. A pump is situated at a side part of the vacuum room 407 and the vacuum room 407 is connected to an evacuation system handling 15,000 liters per minute. Hence, most of the carrier gas is evacuated here (differential pumping). The vacuum room 407 has a length of approximately 5 cm in directions which the particles are led. A hole forming part having a diameter of approximately 5 mm is positioned at a side opposite to the leading part. Although the Ni particles led to the vacuum room 407 are spread in space due to the influence of the carrier gas, most of the Ni particles are led to a high vacuum room 408 having a pressure of approximately $10^{-4}$Pa via the above mentioned hole forming part.

An entry part of the high vacuum part 408 has a cylinder-shaped configuration having a diameter of approximately 5 cm. An electrostatic lens system 409 is provided at the entry part. In this example, the electrostatic lens 409 includes circular plates 409a and 409b having holes with a distance of approximately 3 cm between them. The diameter of the hole is approximately 2 cm. A voltage of 100V is added to the circular plate 409a and a voltage of 640V is added to the circular plate 409b. The particle beam that is slightly spread due to the influence of the carrier gas is converged by the electrostatic lens system 409. The voltage is determined based on a spread angle of the particle beam. In this example, it is assumed that the particle beam has a diameter of 5 mm and a spread angle of approximately 5 degrees at the entry part of the electrostatic lens system 409. The spread angle depends on the diameters of the particles and generally obtained by experiment. The above mentioned electrostatic lens system 409 can be used for convergence of a normal ion beam and electron beam. Since the above mentioned electrostatic lens system 409 is a convergent method insensitive to mass or amount of electrical charge, the electrostatic lens system 409 is effective for the particle beam.

For increase or decrease of the speed of the Ni particle, an additional circular plate having a hole may be installed before or after the electrostatic lens system 409. Just after the electrostatic lens system 409, 7 cm downstream in this example, a movable stage 411 is provided. A substrate 410 having a via hole forming part is fixed on the movable stage. The movable stage 409 is movable in a horizontal direction. The Ni particles can be deposited on the bottom part of the via hole forming part provided at the entire surface of the substrate by scanning the substrate 410. The movable stage 411 can also be moved in a vertical direction and therefore the distance between the electrostatic lens system 409 and substrate 410 can be adjusted. It is effective to lower the temperature of the substrate to 0° C., for example, in order to ease the recoil at the bottom part of the via hole forming part of the high speed particles. For this reason, a temperature adjustment mechanism may be provided at the movable stage 111.

Next, a process for forming carbon nanotubes by using the Ni particles as catalysts is explained.

Figure 9:
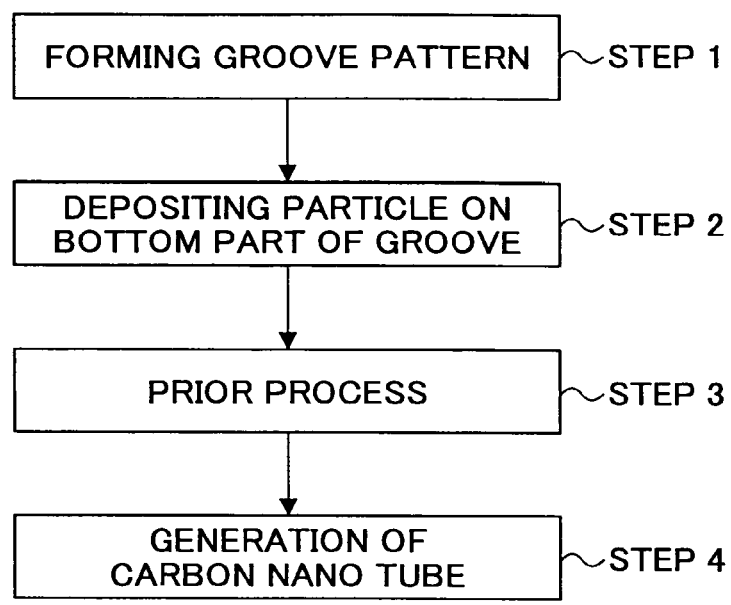
FIG. 9 is a flow chart showing a process for forming a carbon nanotube of the first example of the first embodiment of the present invention.
Figure 10:
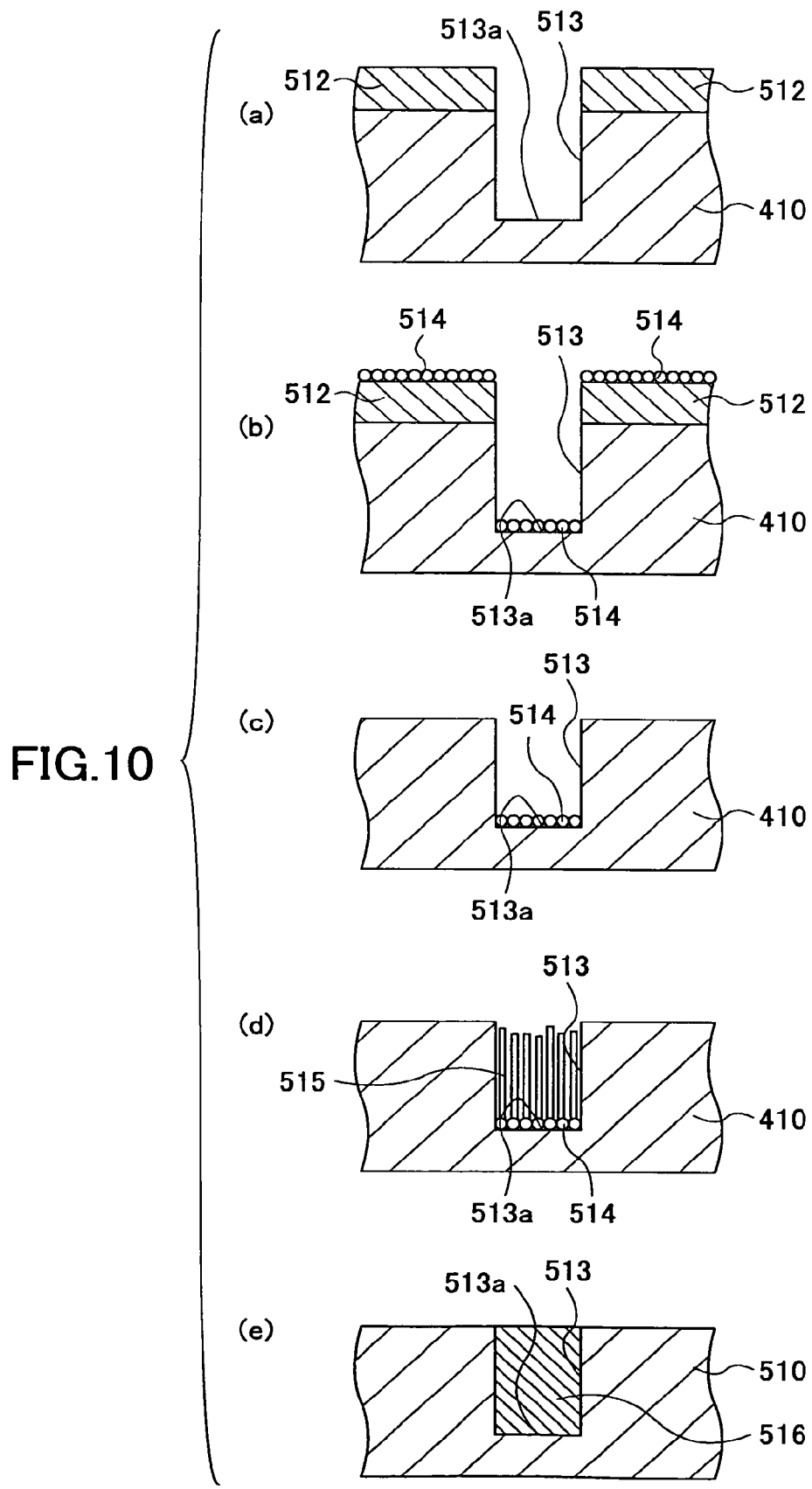
FIG. 10 is a schematic cross-sectional view showing a state of the first example of the first embodiment where the carbon nanotube is formed in a via hole of a substrate.

FIG. 9 is a flowchart showing a process for forming carbon nanotubes of the first example of the first embodiment of the present invention. FIG. 10 is a schematic cross-sectional view showing a state of the first example of the first embodiment where the carbon nanotubes are formed in a via hole of a substrate.

As shown in FIG. 10-(a), a resist pattern 512 is formed on a substrate 410 (or a structural body formed on the substrate 410). Next, a pattern is formed by photo lithography and followed by dry etching on the substrate 410 by using a resist pattern 512 as a mask so that a via hole forming part 513 is formed. (Step 1)

Next, as shown in FIG. 10-(b), the particle beam having high directivity is irradiated to the substrate 410 by using a particle deposition apparatus having a structure shown in FIG. 7. At this time, the Ni particles 514 are deposited on the resist pattern 112. The Ni particles 514 are also deposited substantially only on bottom part 513a of the via forming part 513. (Step 2)

Next, as shown in FIG. 10-(c), after the resist pattern 512 is removed by an asking process or the like, an annealing process as a process prior to CVD is performed at approximately 600° C. in an $H_2$ environment having a pressure of approximately $10^3$Pa. (Step 3)

Next, carbon nanotubes 515 are formed with the CVD method by using the Ni particles 514 deposited on the bottom part 513a of the via hole forming part 513 as a catalyst. (Step 4) In this case, as shown in FIG. 10-(d), the carbon nanotubes 515 are grown substantially perpendicularly from the Ni particles 514 so as to fill in the via hole forming part 513. As a result of this, as shown in FIG. 10-(e), a plug 516 made of carbon nanotubes is formed.

According to the above described first example, particles can be deposited on substantially only a bottom part of a groove structure having a high aspect ratio, for example, only a bottom part of a via hole of a semiconductor wire, as well as a plane part. Because of this, the carbon nanotubes can be grown in the groove structure with precise controllability by using the deposited particles as catalysts.

[Second Example of First Embodiment]

Figure 11:
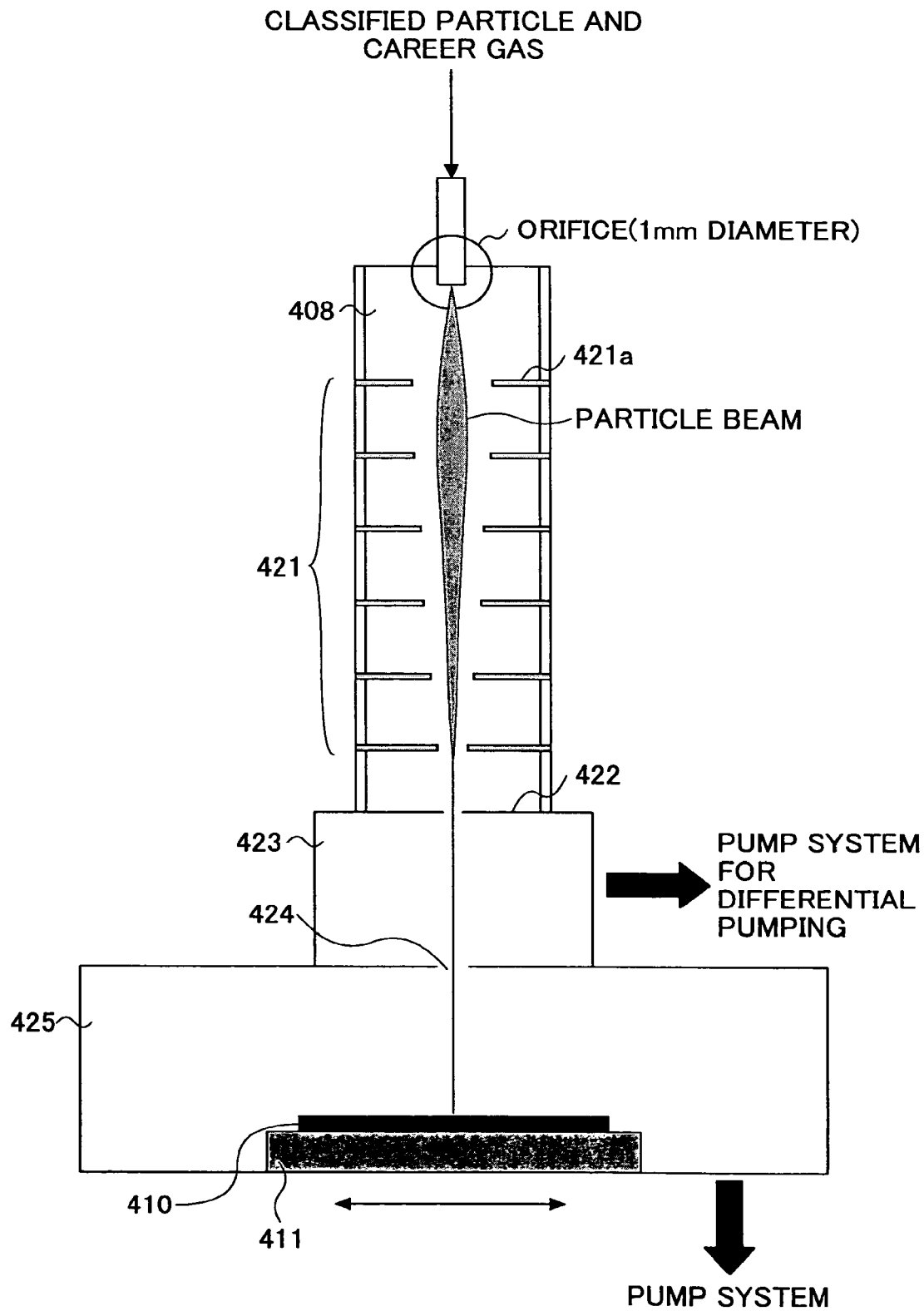
FIG. 11 is a schematic view showing a fine particle beam irradiation part of a particle deposition apparatus of a second example of the first embodiment.

Next, a second example of the first embodiment is explained. FIG. 11 is a schematic view showing a fine particle beam irradiation part of a particle deposition apparatus of the second example of the first embodiment.

In this example, the Ni particles are converged at the vacuum room 408 keeping a pressure of $10^2$Pa, for example, by using an aerodynamic lens 421. The aerodynamic lens 421 includes a plurality of circular plates 421a having holes. The circular plates 421a forming a lens are provided in a flow of gas. The particle beam is converged by using inertia of the particles when the flow repeats contraction and expansion. The proper diameter of the holes of the circular plates depends on the particle size, gas flow rate, and a pressure. In order to converge particles having a diameter of 5 nm under conditions of the above mentioned amount of flow and pressure, it is necessary to provide circular plates having holes whose diameter is approximately 12 mm. By arranging circular plates having holes in order from a large diameter to small diameter in series from upstream to downstream, it is possible to form a particle beam having a diameter less than 1 mm while using particles in a wide size range. In this example, six of the circular plates 421a having external diameters of 5 cm and holes having diameters of 10-20 mm are provided at distances of 10 cm apart so that a particle beam formed by particles having diameters of 3 nm-20 nm can be converged.

After being converged, the particle beam is led to the vacuum room 423 via the orifice 422 which is provided at the downstream end of the aerodynamic lens 421 and has a diameter of 4 mm. A pressure of approximately 10Pa is kept in the vacuum room 423, and a pump for differential pumping is connected to the vacuum room 423. The converged particle beam is led to a high vacuum room 425. In the high vacuum room 425, a pressure of approximately $10^{-4}$Pa is kept. At 7 cm downstream from the orifice 422, the movable stage 411 is provided.

[Third Example of First Embodiment]

In this example, a forming apparatus and a forming method of a carbon nanotube, in a state where a deposition state of particles and a surface state of a substrate are controlled, are described.

Figure 12:
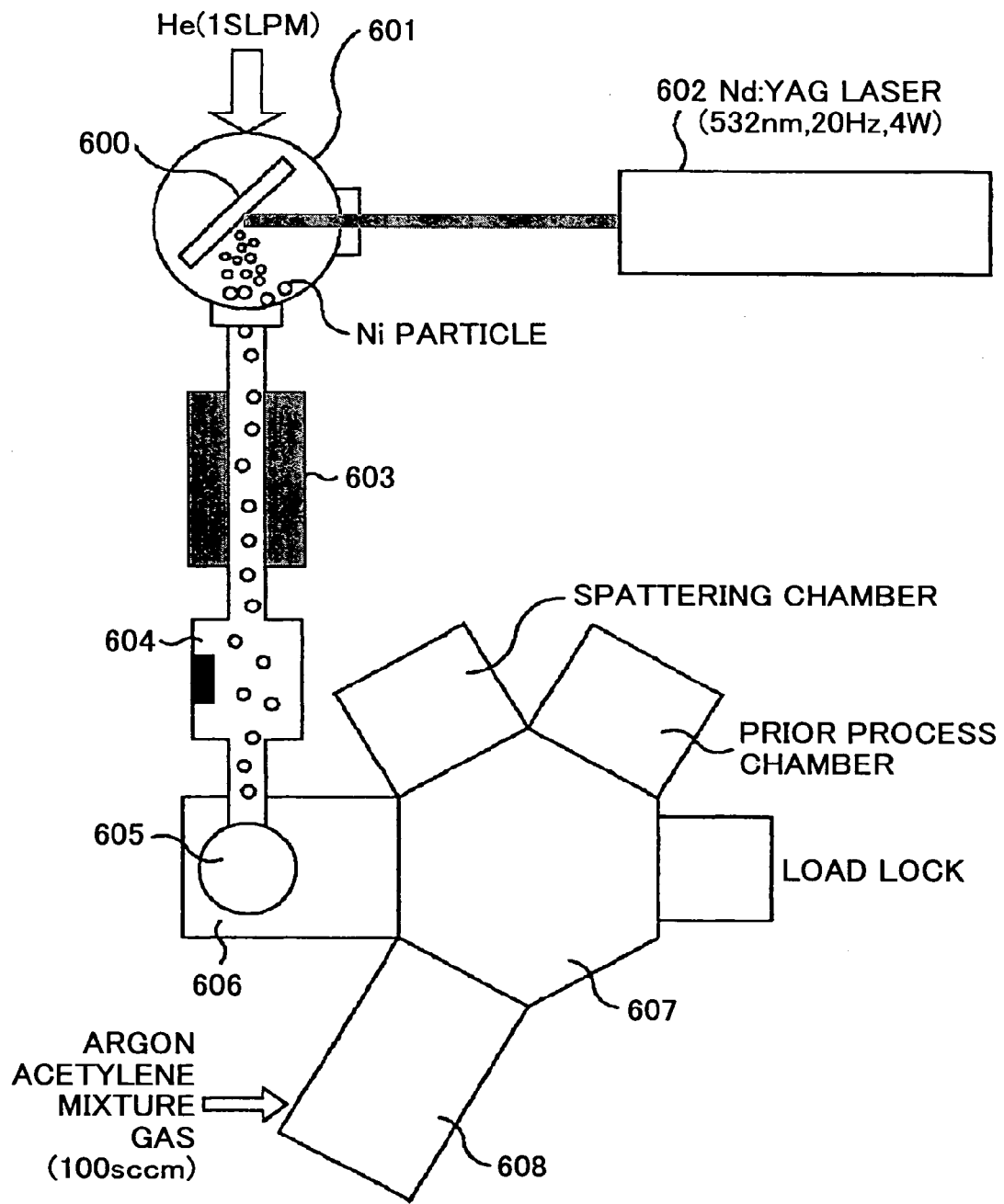
FIG. 12 is a schematic view showing a schematic structure of a forming apparatus of a carbon nanotube of a third example of the first embodiment of the present invention.

FIG. 12 is a schematic view showing a schematic structure of a forming apparatus of a carbon nanotube of the third example of the first embodiment of the present invention. In this example, Ni particles are used as catalyst particles.

In this example, the particles are generated by using a laser ablation. A Ni substrate 600 is provided in a particle generation chamber 601 having a pressure of approximately $3 \times 10^3$Pa. The Ni substrate 600 is hit by a beam generated from the pulse laser 602 (a second harmonic Nd:YAG laser having a repeated frequency 20 Hz, and a wavelength of 532 nm) so that vapor is generated. This vapor is cooled by helium (He) having approximately 99.99995% purity and a flow rate of 1SLPM (standard liter per minute) so that Ni particles (nano-particles) are generated by nucleation.

Next, the generated Ni particles are annealed at approximately 800° C., for example, by a tube-shaped electric furnace 603. And then, the Ni particles are charged by an irradiation source of americium 241 ($^{241}$Am) at a charging apparatus 604 and classified by a DMA (Differential Mobility Analyzer) 605 so that the sizes of the Ni particles are arranged.

A tube with a carrier gas of 1 liter per minute leads the Ni particles passing through the DMA 605 to a deposition chamber 606. The deposition chamber 606 may keep the substantially same pressure as an upstream chamber such as approximately $3 \times 10^3$Pa or may be a lower pressure such as a pressure less than approximately $10^2$Pa. In this example, the pressure is set as substantially the same pressure as the upstream chamber.

A movable stage where a substrate is fixed is provided at the deposition chamber 606. It is possible to add a bias voltage to the movable stage. Almost 100% of charged Ni particles adhere to the substrate because of an electrical field between a nozzle and the charged Ni particles. The amount of the bias voltage depends on particle size or other experimental conditions. In a case where the particles have a size between approximately 1 nm and 10 nm, positively or negatively 100V of the bias voltage may be added. The movable stage is provided so as to scan perpendicularly to a particle injection opening so that the Ni particles can be deposited on the substrate uniformly.

The substrate where the Ni particles are deposited is led to a CVD chamber 608 via the transfer chamber 607. Since the transfer chamber 607 has a pressure less than $10^3$Pa, the introduction of helium gas is stopped first so that an evacuation is performed until the deposition chamber 606 has a pressure substantially the same as the transfer chamber 607. After that, the substrate is moved to the transfer chamber 607 via the gate valve and then moved to a CVD chamber 608 which is evacuated until the CVD chamber 608 has a pressure substantially the same as the transfer chamber 607.

After the substrate where the Ni particles are deposited is led to the CVD chamber 608, a flow rate of 100 sccm of argon acetylene mixture gas (50:50), for example, is led into the CVD chamber 608 and carbon nanotubes are grown. In this case, the substrate temperature is at approximately 700° C. and the pressure is set to approximately $10^3$Pa.

The forming apparatus of carbon nanotubes of this example further includes a spattering chamber, a prior process chamber, and a load lock. These can be used to control the surface state or the material of a substrate or the like.

The carbon nanotubes are grown under a clean condition where a deposition condition of the particles and a surface condition of the substrate are controlled, so that it is possible to easily control the growth of the carbon nanotubes and to use the carbon nanotubes for electrical applications.

The present invention is not limited to the above mentioned examples. For example, the second example can be applied to the first example. That is, the particle deposition apparatus shown in FIG. 7 can be applied to the deposition chamber 606 of the carbon nanotube forming apparatus shown in FIG. 12. Because of this, in a structure where a series of steps of generating the particles, depositing the particles on the substrate, and growing the carbon nanotube is performed continuously under a designated environment cut off from the outside, particles can be deposited on substantially only a bottom part of a groove structure having a high aspect ratio.

According to the above described first embodiment, particles can be deposited on substantially only a bottom part of a groove structure having a high aspect ratio, for example, only a bottom part of a via hole of a semiconductor wire, as well as a plane part. Because of this, the carbon nanotube can be grown in the groove structure with precise controllability by using the deposited particles as catalysts.

According to the above described first embodiment, the carbon nanotube is grown under a clean state where a deposition state of the particles and a surface state of a substrate are controlled, so that it is possible to easily control the growth of the carbon nanotube and its electrical application.

[Second Embodiment]

Figure 13:
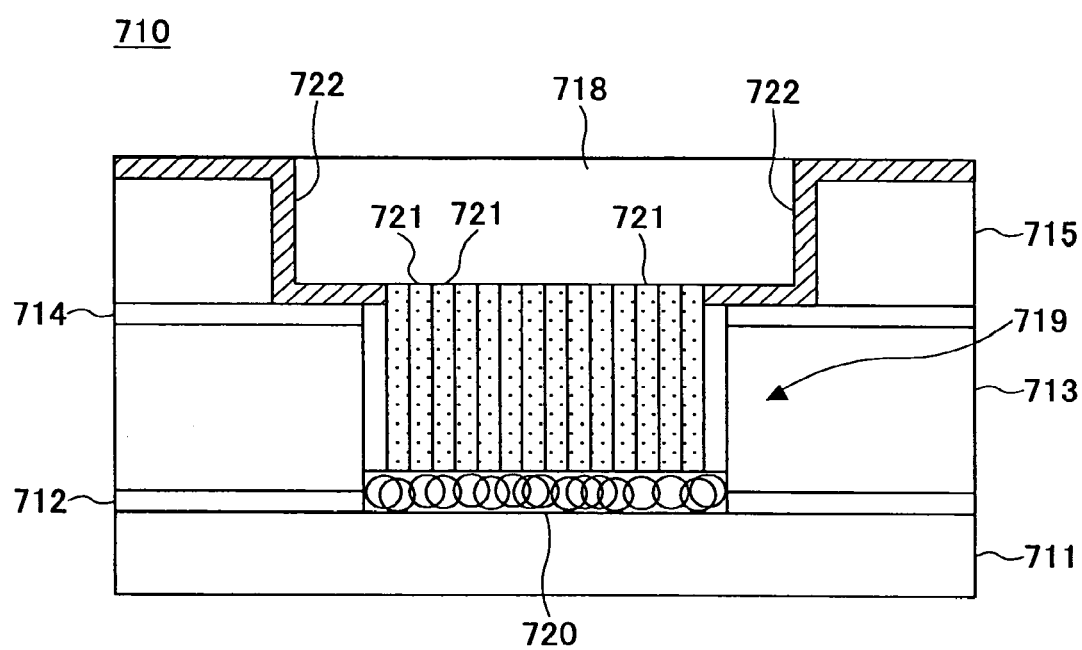
FIG. 13 is a cross-sectional view of the main point of a semiconductor device of a second embodiment of the present invention.

FIG. 13 is a cross-sectional view of the main point of a semiconductor device of a second embodiment of the present invention.

Referring to FIG. 13, a semiconductor device 710 has a multilayer interconnection structure having a dual damascene structure. More specifically, the semiconductor device 710 has a structure wherein an etching stopper layer 712, a first interlayer insulating film 713, an etching stopper layer 714, and a second interlayer insulating film 715 are deposited on a lower wiring layer 711 in order. In this structure, an upper wiring layer 718 is formed in the second interlayer insulating film 715. Furthermore, in this structure, a via hole forming part 719 is formed by piercing the first interlayer insulating film 713 and the etching stopper layers 712 and 714, so that the lower wiring layer 711 and the upper wiring layer 718 are electrically connected. The via hole forming part 719 includes a fine particle catalyst layer 720 formed on a surface of the lower wiring layer 711 and a plurality of carbon nanotubes 721 extending in a perpendicular direction to and provided on the fine particle catalyst layer 720. A lower end of the carbon nanotube 721 comes in contact with the fine particle catalyst layer 720. An upper end of the carbon nanotube 721 comes in contact with the upper wiring layer 718 or a barrier metal layer 722 formed at a lower side of the upper wiring layer 718 or a plating seed layer (not shown in FIG. 13). Under the above described structure, the lower wiring layer 711 and the upper wiring layer 718 electrically and directly or indirectly connect to the carbon nanotubes 721.

The carbon nanotube 721 has a cylinder-shaped configuration wherein a graphite sheet, which is called a graphene sheet and formed by a six-membered ring formed by $sp^2$ combination of carbon atoms, is wound. A tunnel is formed inside of the carbon nanotube 721 in a longitudinal direction. The diameter of the tunnel is the internal diameter of the carbon nanotube 721. The external diameter of the carbon nanotube 721 is determined by the internal diameter of the carbon nanotube 721 and the number of layers.

The carbon nanotube 721 used for the semiconductor device in this embodiment is made by a CVD method such as a thermal CVD method or a plasma CVD method. In the CVD method, the carbon nanotube 721 is grown by using a transition metal forming the fine particle catalyst layer 720 formed on the lower wiring layer 711 or alloy including the transition metal as a core. Although the fine particle catalyst layer 720 is shown as a layer shape in FIG. 13, as described below, the fine particle catalyst layer 720 is formed by an aggregate of the fine particles.

Figure 14:
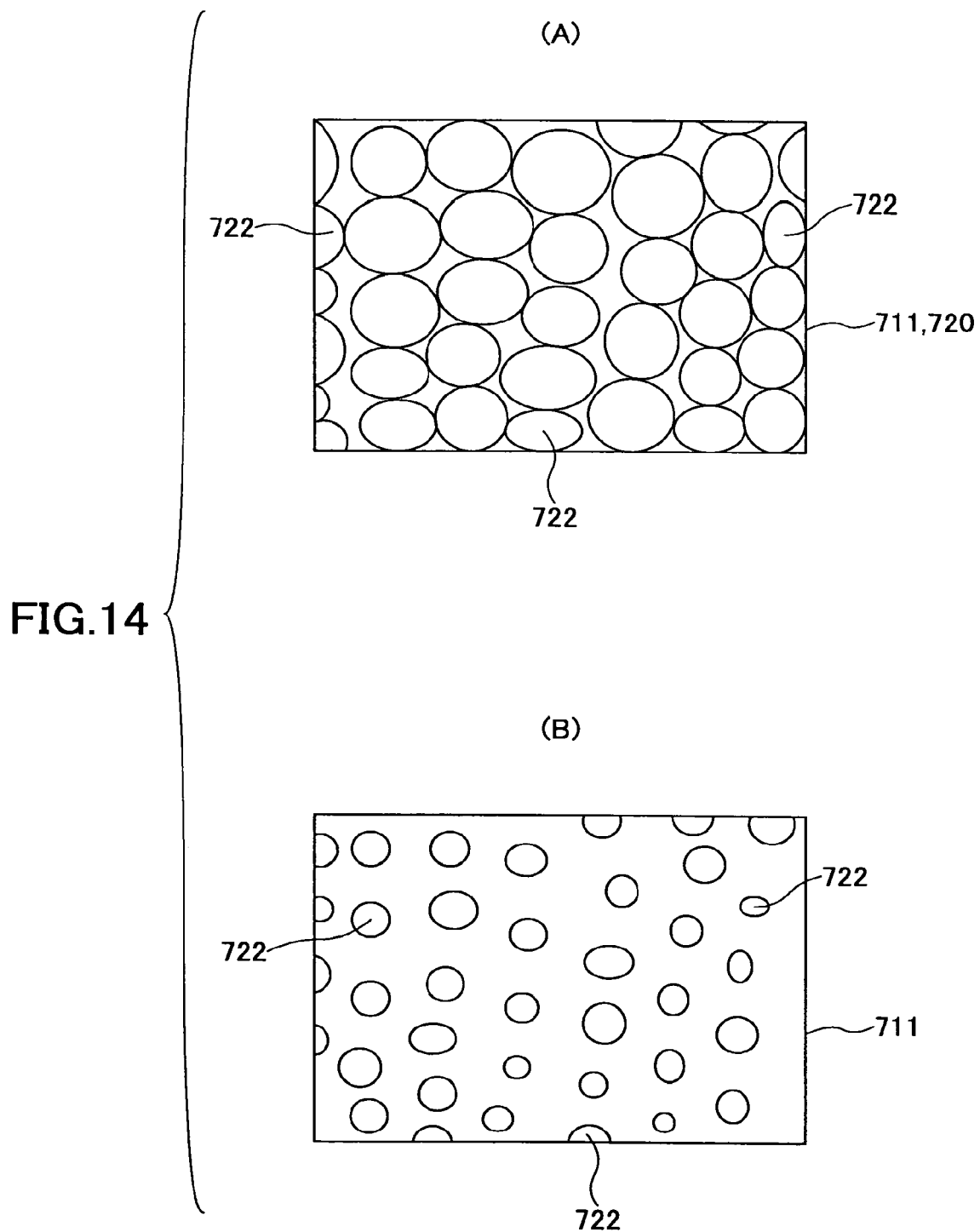
FIG. 14 is a plan view and a schematic view of a fine particle state catalyst layer of the second embodiment of the present invention.

FIG. 14 is a plan and a schematic view of a fine particle catalyst layer of the second embodiment of the present invention. Referring to FIG. 14-(A), a lot of fine particles 722 made by a transition metal alloy or the like are provided on a surface of the lower wiring layer 711. The fine particles 722 form the fine particle catalyst layer 720. The fine particles 722 have an average particle diameter of 0.4 nm through 20 nm, more preferably 0.4 nm through 5 nm. The carbon nanotube 721 has a diameter whose length is substantially the same as a side of a fine particle 722, namely 0.4 nm through 20 nm. By setting the average particle diameter of the fine particle 722 to the above mentioned range, it is possible to control the diameter of the carbon nanotube 721 grown by using the fine particle 722 as a core.

The width of the fine particle catalyst layer 720 may be formed by depositing more than two fine particles 722. Because a fine particle 722 is formed on a surface of the fine particle catalyst layer 720, the carbon nanotube 721 can be grown by using the fine particle 722 as a core. In terms of electric conductivity, it is preferable that the fine particle catalyst layer 720 be thin, and it is most preferable that only one fine particle 722 in a width direction be used for the fine particle catalyst layer 720 as long as the growth of the carbon nanotube 721 is not disturbed.

Furthermore, referring to FIG. 14-(B), the fine particle catalyst layer 720 may be formed in a state where the fine particles 722 are formed separated from each other on a surface of the lower wiring layer 711. By making a space between the fine particles 722, it is possible to avoid a growth in a layer width direction of a carbon nanotube 721 being disturbed due to contact with neighboring carbon nanotubes 721. In addition, it is possible to form carbon nanotubes 721 having the substantially same external diameters with a good filling ratio. The spaces between the fine particles 722 are properly selected based on a layer width of the carbon nanotubes 21 to be formed. For example, the space is set as greater than 0.335 nm and more. Furthermore, a layer width of the carbon nanotube 21 is controlled by the density of a material gas used for the CVD method, the amount of flow, the growth time, and the like.

A transition metal such as Co, Ni, Fe, or Mo, or an intermetallic compound including two or more kinds of the above mentioned transition metals and P or N, for example, form the fine particle catalyst layer 720. In a case where the catalyst layer is a continuous film (solid film), although the carbon nanotubes 721 are grown, the diameters of the carbon nanotubes 721 vary. In this embodiment, since the fine particle catalyst layer 720 is formed by fine particles whose particle diameters are controlled, it is possible for a bundle of the carbon nanotubes 721 to have the substantially same diameter.

A lower end of the carbon nanotube 721 may directly make contact with the lower wiring layer 711. It is possible to reduce contact resistance in this case more than a case of contact via the fine particle catalyst layer 720. For example, as shown in FIG. 14-(B), such situation can be achieved by forming fine particles which are separated from each other.

Next, a manufacturing method and a structure of the semiconductor device of this embodiment are discussed.

Figure 15:
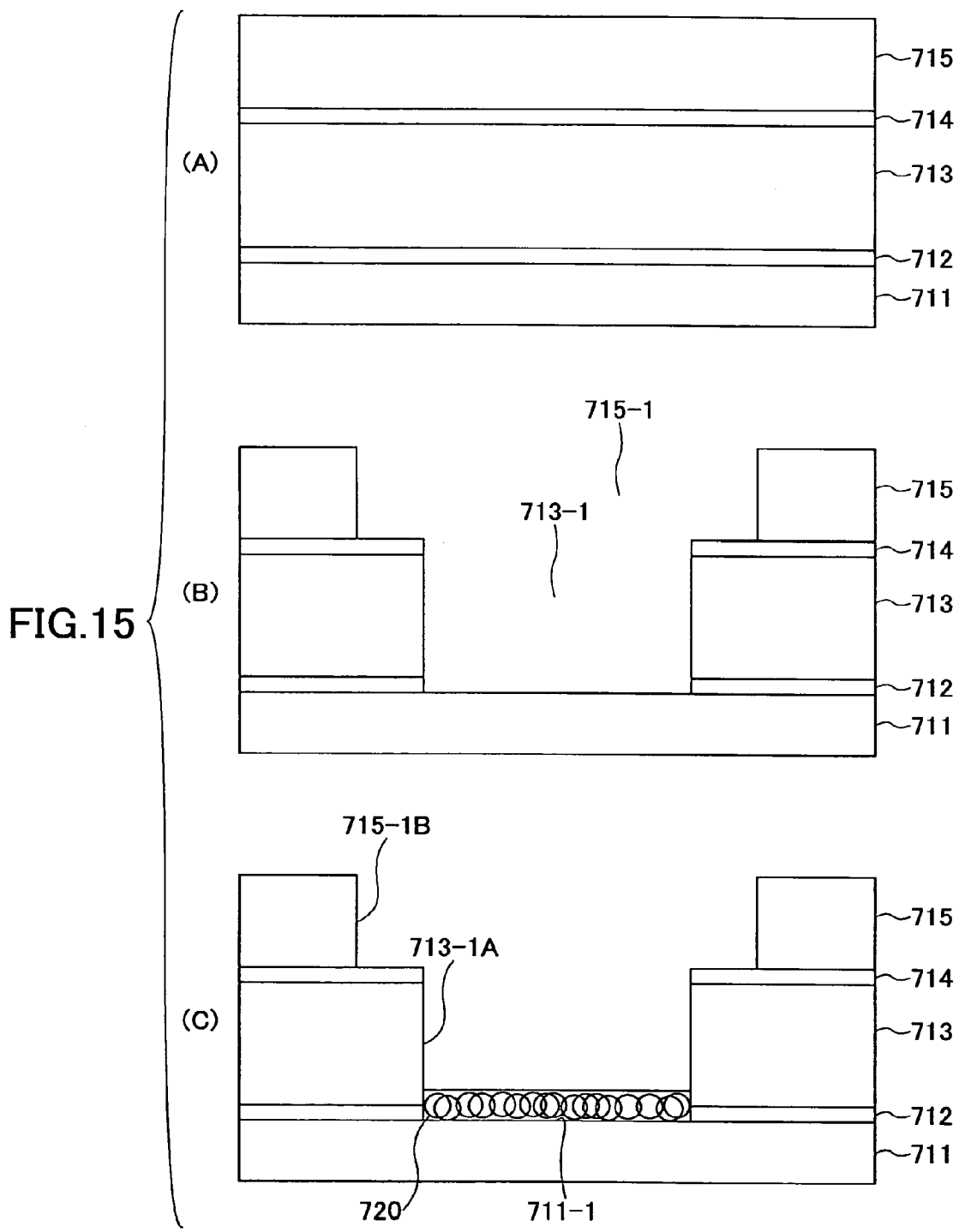
FIG. 15 is a first view of a manufacturing process of the semiconductor device of the second embodiment of the present invention.
Figure 16:
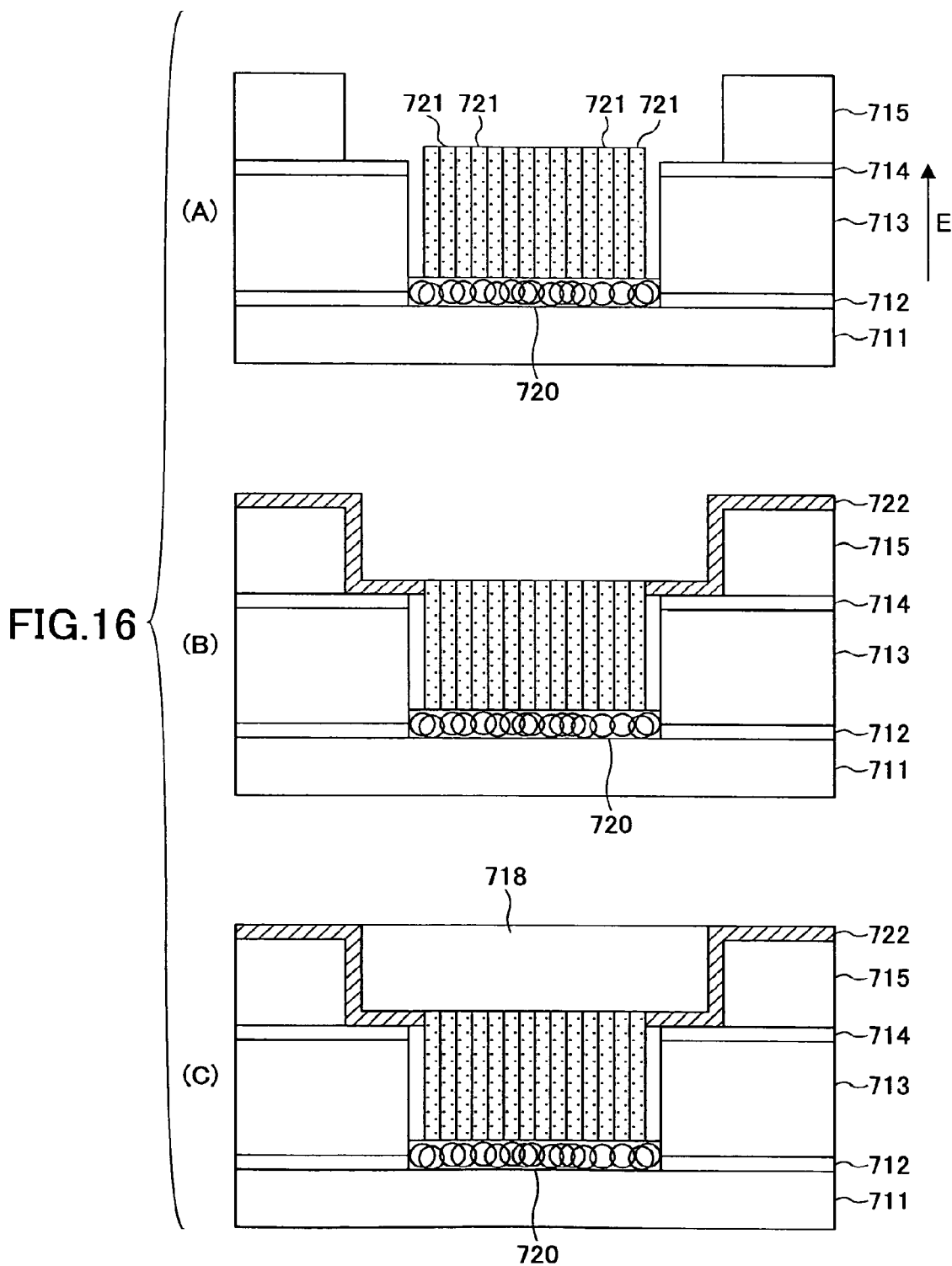
FIG. 16 is a second view of a manufacturing process of the semiconductor device of the second embodiment of the present invention.

FIG. 15 is a first view of a manufacturing process of a semiconductor device of the second embodiment of the present invention. FIG. 16 is a second view of the manufacturing process of the semiconductor device of the second embodiment of the present invention. In a process shown in FIG. 15-(A), the lower wiring layer 711 formed by Al, Cu, or the like is formed on a surface of a substrate, the interlayer insulating film, or the like (not shown in FIG. 15), by a spattering method, a deposition method, a plating method, or the like. The lower wiring layer 711 may be provided in a wiring groove of the interlayer insulating film.

In the process shown in FIG. 15-(A), furthermore, the etching stopper layer 712 having a width of 100 nm and made of a silicon nitride film is formed on the lower wiring layer 711 by the spattering method or the like.

In the process shown in FIG. 15-(A), furthermore, the first interlayer insulating film 713 having a width of 1000 nm, for example, is formed on the etching stopper layer 712. An inorganic insulating film such as a silicon oxide film, SiOF film, BSG film or an organic insulating film such as MSQ (Methylsilsesquioxane) group porous film, a polyimide film, or a parylene film, may be used for the first interlayer insulating film 713. The material for the first interlayer insulating film 713 is not limited to these materials. A via hole forming part 713-1 shown in FIG. 15-(B) which is formed in the first interlayer insulating film 713 is filled with the carbon nanotubes 721. Hence, even if a porous film is used for the first interlayer insulating film 713, it is not necessary to provide a barrier film for preventing mutual nucleic acid at a boundary with the porous film on a side wall of the via hole forming part 713-1. Therefore, it is possible to easily use an organic insulating film or an inorganic insulating film having a low dielectric constant.

In the process shown in FIG. 15-(A), furthermore, the etching stopper layer 714 is formed on the first interlayer insulating film 713 by a process similar to a process for the etching stopper layer 712. Furthermore, the second interlayer insulating film 715 is formed by a material similar to a material for the first interlayer insulating film 713.

Next, in a process shown in FIG. 15-(B), by a resist method or RIE (Reactive Ion Etching) method, the second interlayer insulating film 715, the etching stopper layer 714, the first interlayer insulating film 713, and the etching stopper layer 713 are cut so as to expose the lower wiring layer 711. This forms a wiring groove 715-1 in the second interlayer insulating film 715, and the via hole forming part 713-1 in the first interlayer insulating film 713.

Next, in a process shown in FIG. 15-(C), the fine particle catalyst layer 720 is formed on a surface 711-1 of the lower wiring layer 711 at the bottom of the via hole forming part 713-1, by an electroless plating method. More specifically, as an example, the fine particle catalyst layer 720 made of CoWP is formed by using a plating bath wherein the plating bath temperature is approximately 90° C. and the time for plating is one second through 15 seconds, under the following conditions.

Plating bath (pH=10)
$CoSO_4.7H_2O$=14 g/L
$Na_2WO_4.2H_2O$=48 g/L
$Na_2C_6H_5O_7.2H_2O$=88 g/L
$(NH_4)_2SO_4$=66 g/L
$NaH_2PO_2.H_2O$=21 g/L The average diameter of the fine particles can be controlled by controlling the time for plating, for example. As described above, the average particle diameter is set to have a length of 0.4 nm through 20 nm, more preferably 0.4 nm through 5 nm. The fine particles are generated and adhered on the surface 711-1 of the lower wiring layer 711 so that the fine particle catalyst layer 720 is formed substantially evenly. An inventor of this patent application realized that the fine particles do not adhere to the side wall 713-1A of the via hole forming part 713-1, the bottom part 715-1A of the wiring groove 715-1, or the side wall 715-1B of the wiring groove 715-1, or grow in a case where the fine particle catalyst layer 720 is formed by an electroless plating process. This may be because an electron of a reducer is supplied to only the vicinity of the surface 711-1 of the lower wiring layer 711 due to a difference of the distribution of an electro kinetic potential (zeta electric potential) of the first interlayer insulating film 713, the second interlayer insulating film 715, etching stopper layers 712 and 714, and the lower wiring layer 711, and therefore the fine particles are generated and adhere to only the surface 711-1 of the lower wiring layer 711.

Next, in a process shown in FIG. 16-(A), the carbon nanotubes 721 are formed by a method such as the thermal CVD method or the plasma CVD method. More specifically, by using the thermal CVD method, carbon hydride type gas such as acetylene or methane is used as material gas and hydride gas is used as carrier gas and the heating temperature is set as 400° C. through 900° C., more preferably 400° C. through 600° C. and pressure is set as 1 kPa. In addition, an electrical field E is added to a substrate where the semiconductor device is formed, in a layer width direction, by a bias of −400V. Under the above described conditions, the carbon nanotubes 721 grow from the fine particle catalyst layer 720 in the layer width direction so as to fill the via hole forming part 713-1. The lengths of the carbon nanotubes 721 are slightly longer than the depth of the via hole forming part 713-1. Thus, it is possible to achieve good electrical contact with the barrier metal film 722 or the upper wiring layer 718 (See FIG. 13).

The diameter of the carbon nanotube 721 depends on the size of the fine particle, as described above. The number of the carbon nanotubes 721 can be controlled by the amount of carbon contained in the material gas, the flow amount of the material gas, or the like. Furthermore, a material made by sublimating floren or alcohol can be used. In a growth mode of the carbon nanotube 721, the carbon nanotube 721 may have fine particles provided at a head point of the growth point, or at a base point of the growth point. It is common for the fine particles to remain at the base point in a case of the thermal CVD, and at the head point in the case of the plasma CVD.

Figure 17:
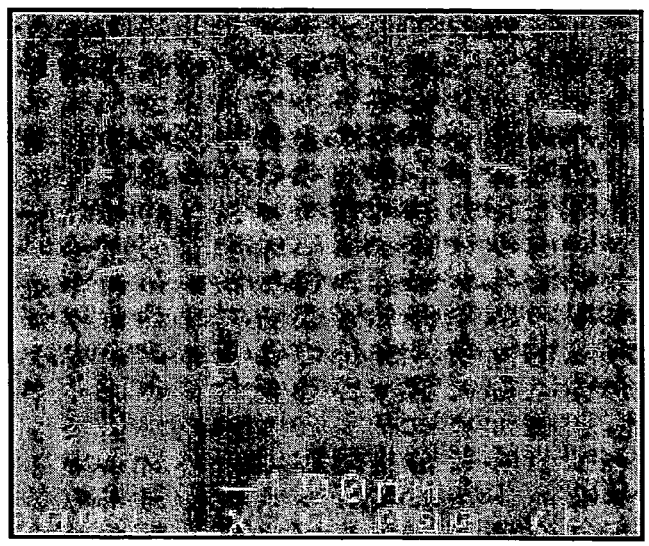
FIG. 17 is an SEM (Scanning Electron Microscope) picture of a carbon nanotube used for the semiconductor device of the second embodiment.
Figure 18:
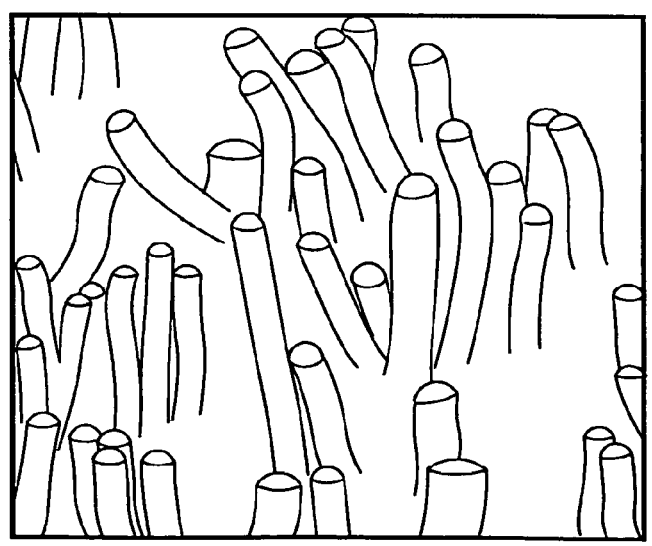
FIG. 18 is a view for explaining the SEM picture shown in FIG. 17.

FIG. 17 is an SEM (Scanning Electron Microscope) picture of a carbon nanotube used for the semiconductor device of the second embodiment. FIG. 18 is a view for explaining the SEM picture shown in FIG. 17. Referring to FIG. 17 and FIG. 18, it is found that a bundle of the carbon nanotubes 721 grown in a perpendicular (longitudinal) direction are formed closely.

In the radius direction of the carbon nanotubes 721, there may be either a single layer carbon nanotube or multilayer carbon nanotubes. In the case of the multilayer carbon nanotubes, it is preferable that the internal diameter be small and the number of layers be large, so that it is possible to make the electric resistance of the carbon nanotubes small so that even a narrow opening part can be filled with a lot of the carbon nanotubes because the external diameter is small despite the large number of layers. Because of this, a via resistance can be reduced. For example, it is most preferable that the internal diameter be set as 0.4 nm through 2 nm and a number of layers be set as two through twenty.

Next, in a process shown in FIG. 16-(B), a barrier metal film 722 having a width of 10 nm, for example, is formed with a material such as TaN or TiN by using a spattering method so as to cover a surface of the structure body shown in FIG. 16-(A). The barrier metal film 722 prevents a migration of Cu at the upper wiring layer 718 and secures an electrical connection with the carbon nanotube 721.

Next, in a process shown in FIG. 16-(C), a seed layer (not shown in FIG. 16) made of Cu is formed by a spattering method so as to cover a surface of the structure body shown in FIG. 16-(B), and a Cu plating film having a width of 1500 nm is formed by an electrical plating method.

In the process shown in FIG. 16-(C), furthermore, the above mentioned Cu plating film is made flat with a CMP method by using the barrier metal film 722 or the second interlayer insulating film 715 as a polishing stopper. The upper wiring layer 718 may directly connect to the carbon nanotubes 721. As a result of this, the semiconductor device wherein the upper wiring layer 718 and the lower wiring layer 711 are electrically connected by the carbon nanotubes 721 can be formed.

According to this embodiment, the fine particle catalysts 720 for growing the carbon nanotubes 721 can be formed on only the surface 711-1 of the lower wiring layer 711, namely a bottom part of a via hole forming part having a high aspect ratio by an electroless method, and its film width is uniform. Therefore, it is possible to grow the carbon nanotubes 721 which are uniform and whose compression is small from the fine particle catalyst 720, and thereby it is possible to achieve good electrical connection with the lower wiring layer 711. Furthermore, since fine particles having uniform sizes are formed, the carbon nanotubes 721 having substantially the same internal and external diameters, namely uniform electric properties, can be formed.

Although the dual damascene structure is used as an example in this embodiment, a single damascene structure can be used. Furthermore, instead of the lower wiring layer 711, a diffusion area formed on a semiconductor substrate can be used. In addition, a contact layer made of a silicide compound such as CoSi, TiSi, TaSi, PtSi, and NiSi, which forms an ohmic contact, may be provided between the diffusion area and the fine particle catalyst layer 720. Because of this, it is possible to reduce the contact resistance between the diffusion area and the fine particle catalyst layer 720.

[Third Embodiment]

Figure 19:
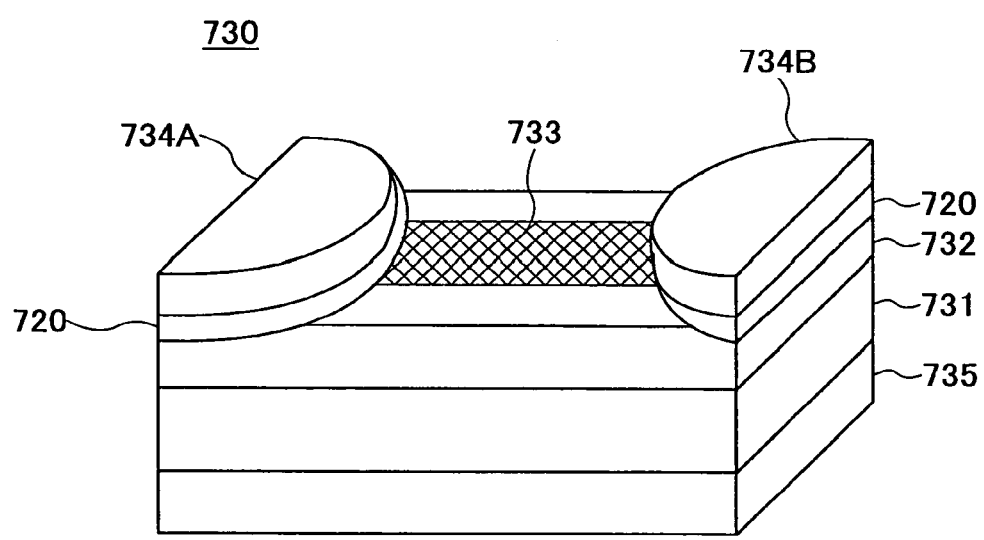
FIG. 19 is a cross-sectional view of the main point of a semiconductor device of a third embodiment of the present invention.

FIG. 19 is a cross-sectional view of the main point of a semiconductor device of a third embodiment of the present invention. Referring to FIG. 19, the semiconductor device 730 of this embodiment is formed by a semiconductor substrate 731 having a low specific resistance, a silicon oxide film 732 formed on the semiconductor substrate 731, two fine particle catalyst layers 720 formed separated from each other on the silicon oxide film 732, carbon nanotubes 733 formed between the fine particle catalyst layers 720, a source electrode 734A and drain electrode 734B formed on corresponding fine particle catalyst layers 720, a gate electrode 735 formed at a side opposite to a silicon insulating layer 732 of the semiconductor substrate 731, and others. The semiconductor device 730 is a so-called back gate type semiconductor device. Corresponding to a voltage added to the gate electrode 735, an electrical field is added to the carbon nanotubes so that the carbon nanotubes function as a channel of a transistor and an electrical current between the source electrode 734A and a drain electrode 734B is changed. Since the fine particle catalyst layer 720 is provided at the semiconductor device 730 in this embodiment, the semiconductor device 730 has carbon nanotubes which have good controllability of measurement. By using carbon nanotubes having substantially the same dimensions, particularly internal diameter and external diameter, for the transistor, non-evenness of properties between the transistors are reduced so that the semiconductor device 730 having high reliability can be obtained.

Figure 20:
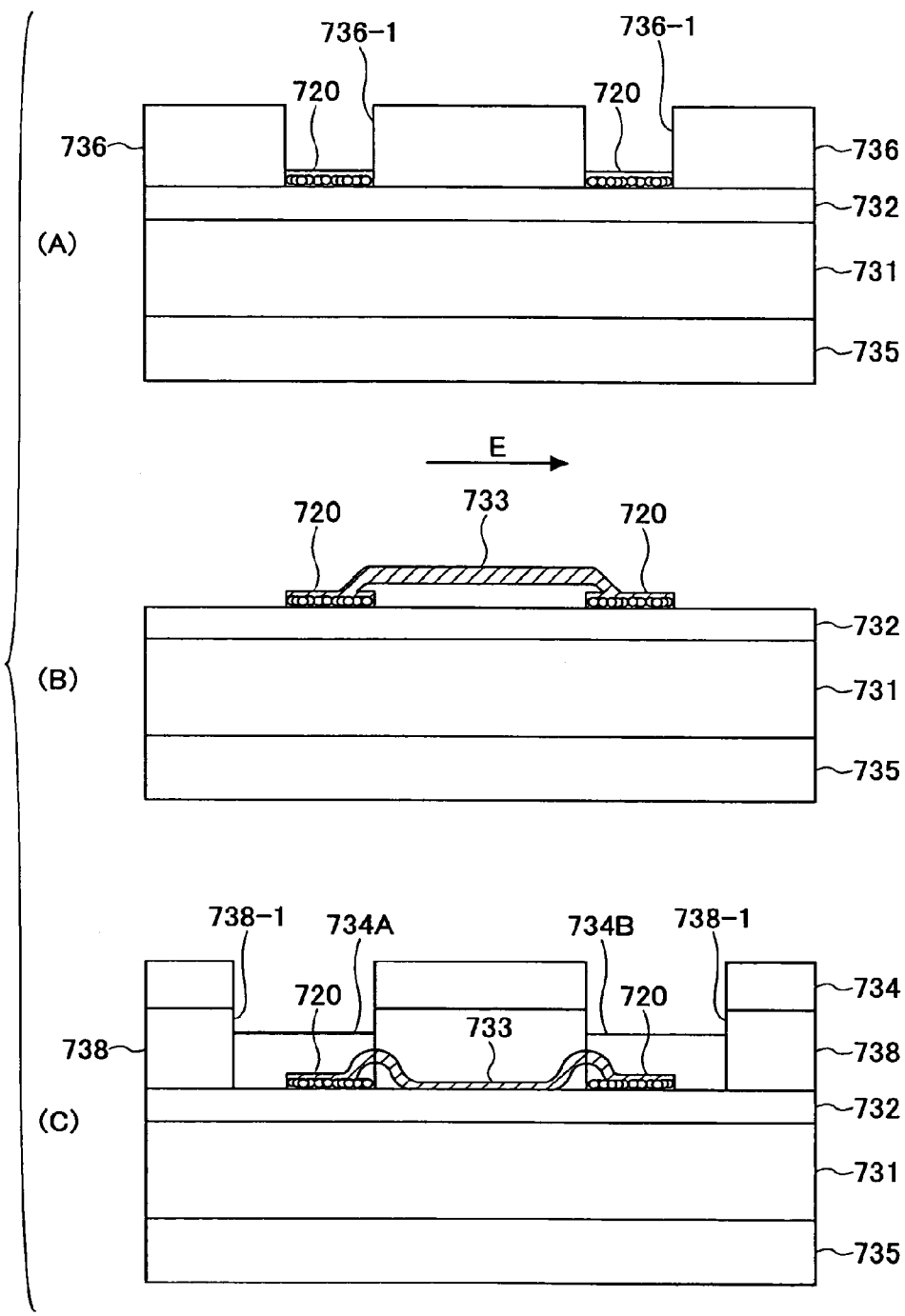
FIG. 20 is a first view of a manufacturing process of the semiconductor device of the third embodiment of the present invention.

Next, a manufacturing method and a structure of the semiconductor device 30 of this embodiment are described. FIG. 20 is a first view of a manufacturing process of the semiconductor device of the third embodiment of the present invention.

In a process shown in FIG. 20-(A), a silicon substrate having a width of 500 µm is used as the semiconductor substrate 731. Donor or acceptor impurity ions are introduced in the semiconductor substrate 731 and the semiconductor substrate 731 has a low specific resistance. On a surface of the semiconductor substrate 731, a silicon oxide film 732 having a width of 1 nm through 100 nm is formed by thermal oxidation. The silicon oxide film 732 may be formed by the CVD method, the spattering method, or the like.

In the process shown in FIG. 20-(A), the gate electrode 735 made of a conductive material such as Al is formed at a side opposite to the silicon oxide film 732 of the semiconductor substrate 731 via the Co silicide film, for example.

Furthermore, in the process shown in FIG. 20-(A), a resist film having a pattern opening is formed on the silicon insulating film by a photography method. Since the source electrode 734A and the drain electrode 734B are formed in the openings of the resist film, the resist openings are formed having a gap whose length is 50 nm through 100 µm, for example.

In the process shown in FIG. 20-(A), furthermore, the fine particle catalyst layer 720 is formed on a surface of the silicon oxide film 732 at the opening parts by an electroless plating method. The fine particle catalyst layer 720 is formed by a method substantially the same as shown in FIG. 15-(C). Although in the process fine particles forming the fine particle catalyst layer 720 may be adhere to a surface of the resist film, there is no problem because the resist film is removed prior to forming the carbon nanotubes.

Next, in a process shown in FIG. 20-(B), after the resist film is removed, the carbon nanotube 733 is formed by the thermal CVD method, the plasma CVD method, or the like. Although the carbon nanotube 733 is formed by a method substantially the same as shown in FIG. 16-(A), the electrical field is added to the substrate in parallel in this process. The carbon nanotube grows from the fine particle catalyst layer so that two fine particle catalyst layers are connected by a single carbon nanotube. Conditions for growing the carbon nanotube are the same as the process shown in FIG. 16-(A). Thus, in a case where the carbon nanotube grows as bridging between the fine particle metals, normally a single carbon nanotube grows.

Next, in a process shown in FIG. 20-(C), a resist film 738 having a pattern opening is formed on the silicon oxide film 732 where the carbon nanotube 721 is formed by a photography method. The opening part of the resist film 738 is formed so as to include the fine particle catalyst layer 720. The carbon nanotube 733 comes in contact with the silicon oxide film 732 because of Van der Waals force and others.

In the process shown in FIG. 20-(C), furthermore, the source electrode 734A is made of a conductive material such as Au and Pt and the drain electrode 734B is formed via a Ti film so as to cover the fine particle catalyst layer 720 by spattering.

Figure 21:
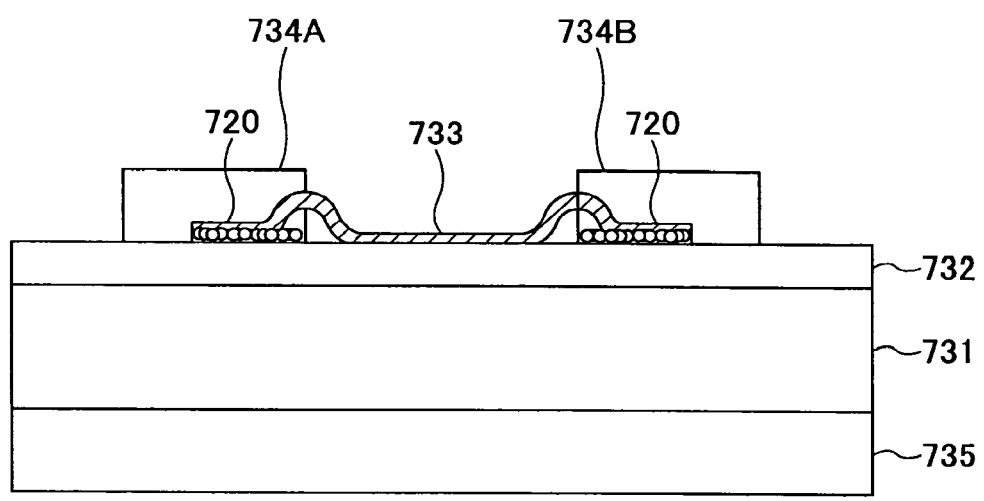
FIG. 21 is a second view of a manufacturing process of the semiconductor device of the third embodiment of the present invention.

Next, in a process shown in FIG. 21, the resist film 738 is lifted off so that the semiconductor device 730 is formed.

According to this embodiment, it is possible to form carbon nanotubes whose diameters are substantially the same by controlling the size of the fine particles of the fine particle catalyst layer 720. Therefore, it is possible to reduce unevenness of the semiconductor devices 730. In addition, it is possible to accomplish making the size of the carbon nanotubes small and to realize a high speed working with the ballistic electron transportation of the electrons. Hence, it is possible to realize a semiconductor device having high reliability.

The present invention is not limited to these embodiments, but variations and modifications may be made without departing from the scope of the present invention.

What is claimed is:

1. A forming method of carbon nanotubes, comprising the steps of:
    irradiating a fine particle beam formed by size-classified catalyst fine particles to an irradiated subject under a vacuum state;
    depositing the fine particles on a bottom part of a groove structure formed at the irradiated subject; and
    generating a carbon nanotube from the bottom part by using the catalyst fine particles as catalysts.

2. A forming method of carbon nanotubes, comprising the steps of:
    generating catalyst fine particles;
    size-classifying the catalyst fine particles to desired fine diameters;
    irradiating a fine particle beam formed by the size-classified catalyst fine particles to an irradiated subject under a vacuum state, so that the catalyst fine particles are deposited on a bottom part of a groove structure formed at the irradiated subject; and
    generating a carbon nanotube from the bottom part by using one of the catalyst fine particles as a catalyst.

3. A forming method of carbon nanotubes, comprising the steps of:
    generating catalyst fine particles;
    depositing the catalyst fine particles on a substrate; and
    generating the carbon nanotube by using one of the catalyst fine particles as a catalyst;
    wherein each step is continuously performed under a designated environment cut off from the outside.

4. The forming method of the carbon nanotubes as claimed in claim 3, wherein the catalyst fine particles are generated by laser ablation.

5. The forming method of the carbon nanotubes as claimed in claim 3, further comprising a step of: size-classifying the catalyst fine particles to a desired fine diameter after the catalyst fine particles are generated before the catalyst fine particles are deposited.

6. The forming method of the carbon nanotubes as claimed in claim 5, wherein the catalyst fine particles are classified based on a difference in electrical mobilities of the catalyst fine particles.

7. The forming method of the carbon nanotubes as claimed in claim 5, wherein the catalyst fine particles are classified based on a difference in inertia of the fine particles.

8. The forming method of the carbon nanotubes as claimed in claim 5, wherein the catalyst fine particles are covered with a material different from the catalyst fine particles before or after the classification of the catalyst fine particles.

9. The forming method of the carbon nanotubes as claimed in claim 3, wherein the catalyst fine particles are charged and deposited on the substrate by an electrical field.

10. The forming method of the carbon nanotubes as claimed in claim 3, wherein a fine particle beam formed by the catalyst fine particles irradiated under a vacuum state and the catalyst fine particles are deposited on the substrate.

11. The forming method of the carbon nanotubes as claimed in claim 3, wherein a fine particle beam formed by the size-classified catalyst fine particles is irradiated to an irradiated subject under a vacuum state, and the catalyst fine particles are deposited on a bottom part of a groove structure formed at the irradiated subject.

12. A forming apparatus of carbon nanotubes, comprising:
    a fine particle generation part configured to generate fine particles;
    a deposition part configured to deposit the catalyst fine particles on a substrate; and
    a tube generation part configured to generate a carbon nanotube by using one of the catalyst fine particles as a catalyst;
    wherein a series of processes from generation of the catalyst fine particles to generation of the carbon nanotubes is continuously performed under a designated environment cut off from the outside.

13. The forming apparatus of the carbon nanotubes as claimed in claim 12, wherein the catalyst fine particles are generated by laser ablation of the fine particle generation part.

14. The forming apparatus of the carbon nanotubes as claimed in claim 12, further comprising: a classification part configured to classify the catalyst fine particles to desired fine diameters after the catalyst fine particles are generated before the catalyst fine particles are deposited.

15. The forming apparatus of the carbon nanotubes as claimed in claim 14, wherein the catalyst fine particles are classified by the classification part based on a difference in electrical mobilities of the catalyst fine particles.

16. The forming apparatus of the carbon nanotubes as claimed in claim 14, wherein the catalyst fine particles are classified by the classification part based on a difference in inertia of the fine particles.

17. The forming apparatus of the carbon nanotubes as claimed in claim 12, wherein the catalyst fine particles are charged and deposited on the substrate by an electrical field.

18. The forming apparatus of the carbon nanotubes as claimed in claim 12, wherein a fine particle beam formed by the size-classified catalyst fine particles is irradiated to an irradiated subject under a vacuum state, by the deposition part.

* * * * *